US006791384B2

United States Patent
Iwashita

(10) Patent No.: US 6,791,384 B2
(45) Date of Patent: Sep. 14, 2004

(54) DELAY ADJUSTMENT CIRCUIT FOR DELAY LOCKED LOOP

(75) Inventor: Tooru Iwashita, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 10/178,660

(22) Filed: Jun. 20, 2002

(65) Prior Publication Data

US 2002/0196062 A1 Dec. 26, 2002

(30) Foreign Application Priority Data

Jun. 26, 2001 (JP) ........................................ 2001-192249

(51) Int. Cl.[7] ............................................... H03L 7/06
(52) U.S. Cl. ........................ 327/158; 327/263; 327/264
(58) Field of Search ................................. 327/158, 263, 327/264, 265, 268, 269, 270, 271, 284, 277

(56) References Cited

U.S. PATENT DOCUMENTS

| | | | | |
|---|---|---|---|---|
| 5,375,470 A | * | 12/1994 | Matsushima | 73/626 |
| 6,313,681 B1 | * | 11/2001 | Yoshikawa | 327/277 |
| 6,377,101 B1 | * | 4/2002 | Eto et al. | 327/270 |
| 6,469,557 B2 | * | 10/2002 | Hirabayashi | 327/263 |

FOREIGN PATENT DOCUMENTS

| | | |
|---|---|---|
| JP | 3-35613 | 2/1991 |
| JP | 11-168376 | 6/1999 |
| JP | 2000-323969 | 11/2000 |
| JP | 2001-56723 | 2/2001 |

* cited by examiner

Primary Examiner—My-Trang Nuton
Assistant Examiner—Hiep Nguyen
(74) Attorney, Agent, or Firm—Ostrolenk, Faber, Gerb & Soffen, LLP

(57) ABSTRACT

A delay adjustment circuit for a delay locked loop, comprises a delay rough adjustment circuit unit (to which input clock signal CLK-IN, and delay control signals A1 to A6 are transmitted) for selectively obtaining outputs of roughly adjusted delays A and B of two systems having a delay difference indicating a maximum delay value of fine interval delay quantity adjustment from selected ones of selection circuits S1, S3 and S5 of an odd-number stage and selection circuits S2, S4 and S6 of an even-number stage connected to delay elements D1 to D3. Furthermore, a delay fine adjustment circuit unit (to which delay control signals B1 to B4, and enable signal ENABLE are transmitted) including delay elements FA and FB for receiving outputs of roughly adjusted delays A and B, and selectively carrying out fine interval delay quantity adjustments of the two systems by opposite operations.

12 Claims, 19 Drawing Sheets

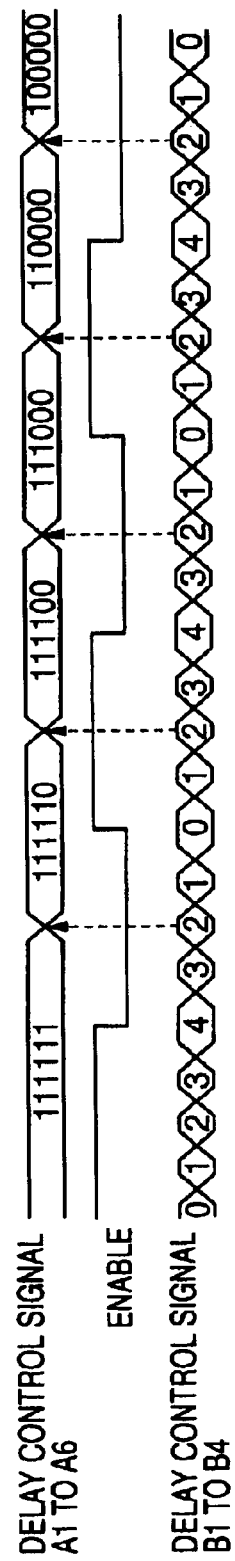

Fig.8

(CASE OF DELAY QUANTITY ADJUSTMENT OF ROUGH INTERVAL BY 1.0ns, AND DELAY QUANTITY ADJUSTMENT OF FINE INTERVAL BY 0.2ns)

| DELAY CONTROL SIGNAL A 6 5 4 3 2 1 | DELAY QUAN-TITY | DE-LAY | DELAY CONTROL SIGNAL B 4 3 2 1 | INPUT SIGNAL TO DELAY ELEMENT FA | DELAY QUAN-TITY | DE-LAY | INPUT SIGNAL TO DELAY ELEMENT FB | DELAY QUAN-TITY | DE-LAY | ENABLE |
|---|---|---|---|---|---|---|---|---|---|---|
| 1 1 1 1 1 1 | +0.0ns | SMALL ↑ | 0 0 0 0<br>0 0 0 1<br>0 0 1 1<br>0 1 1 1<br>1 1 1 1 | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 |
| 1 1 1 1 1 0 | +1.0ns | | 1 1 1 1<br>0 1 1 1<br>0 0 1 1<br>0 0 0 1<br>0 0 0 0 | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 |
| 1 1 1 1 0 0 | | | 0 0 0 0<br>0 0 0 1<br>0 0 1 1<br>0 1 1 1<br>1 1 1 1 | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 |
| 1 1 1 0 0 0 | +2.0ns | | 1 1 1 1<br>0 1 1 1<br>0 0 1 1<br>0 0 0 1<br>0 0 0 0 | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 |
| 1 1 0 0 0 0 | | | 0 0 0 0<br>0 0 0 1<br>0 0 1 1<br>0 1 1 1<br>1 1 1 1 | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 |
| 1 1 0 0 0 0 | | | 1 1 1 1<br>0 1 1 1<br>0 0 1 1<br>0 0 0 1<br>0 0 0 0 | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 |
| 0 0 0 0 0 0 | +3.0ns | LARGE | 0 0 0 0<br>0 0 0 1<br>0 0 1 1<br>0 1 1 1<br>1 1 1 1 | 1 1 1 1<br>0 1 1 1<br>0 0 1 1<br>0 0 0 1<br>0 0 0 0 | +0.0ns<br>+0.2ns<br>+0.4ns<br>+0.6ns<br>+0.8ns | SMALL ↑<br>↓<br>LARGE | 0 0 0 0<br>0 0 0 1<br>0 0 1 1<br>0 1 1 1<br>1 1 1 1 | +0.8ns<br>+0.6ns<br>+0.4ns<br>+0.2ns<br>+0.0ns | LARGE ↑<br>↓<br>SMALL | 1 |

Fig.17

(CASE OF DELAY QUANTITY ADJUSTMENT OF FINE INTERVAL BY 0.2ns)

| DELAY CONTROL SIGNAL B | | | | INPUT SIGNAL TO DELAY ELEMENT FA | | | DELAY QUAN -TITY | DELAY | INPUT SIGNAL TO DELAY ELEMENT FB | | | DELAY QUAN -TITY | DELAY | ENABLE |
|---|---|---|---|---|---|---|---|---|---|---|---|---|---|---|
| 4 | 3 | 2 | 1 | | | | | | | | | | | |
| 0 | 0 | 0 | 0 | 0 | 0 | 0 | +0.0ns | SMALL | 1 | 0 | 0 | +1.4ns | LARGE | |
| 0 | 0 | 0 | 1 | 0 | 0 | 1 | +0.2ns | ↑ | 1 | 0 | 1 | +1.2ns | ↑ | |
| 0 | 0 | 1 | 1 | 0 | 1 | 1 | +0.4ns | | 1 | 1 | 1 | +1.0ns | | |
| 0 | 0 | 1 | 0 | 0 | 1 | 0 | +0.6ns | | 1 | 1 | 0 | +0.8ns | | 1 |
| 0 | 1 | 1 | 0 | 1 | 1 | 0 | +0.8ns | | 0 | 1 | 0 | +0.6ns | | |
| 0 | 1 | 1 | 1 | 1 | 1 | 1 | +1.0ns | | 0 | 1 | 1 | +0.4ns | | |
| 0 | 1 | 0 | 1 | 1 | 0 | 1 | +1.2ns | ↓ | 0 | 0 | 1 | +0.2ns | ↓ | |
| 0 | 1 | 0 | 0 | 1 | 0 | 0 | +1.4ns | LARGE | 0 | 0 | 0 | +0.0ns | SMALL | |
| 1 | 1 | 0 | 0 | 1 | 0 | 0 | +1.4ns | LARGE | 0 | 0 | 0 | +0.0ns | SMALL | |
| 1 | 1 | 0 | 1 | 1 | 0 | 1 | +1.2ns | ↑ | 0 | 0 | 1 | +0.2ns | ↑ | |
| 1 | 1 | 1 | 1 | 1 | 1 | 1 | +1.0ns | | 0 | 1 | 1 | +0.4ns | | |
| 1 | 1 | 1 | 0 | 1 | 1 | 0 | +0.8ns | | 0 | 1 | 0 | +0.6ns | | 0 |
| 1 | 0 | 1 | 0 | 0 | 1 | 0 | +0.6ns | | 1 | 1 | 0 | +0.8ns | | |
| 1 | 0 | 1 | 1 | 0 | 1 | 1 | +0.4ns | | 1 | 1 | 1 | +1.0ns | | |
| 1 | 0 | 0 | 1 | 0 | 0 | 1 | +0.2ns | ↓ | 1 | 0 | 1 | +1.2ns | ↓ | |
| 1 | 0 | 0 | 0 | 0 | 0 | 0 | +0.0ns | SMALL | 1 | 0 | 0 | +1.4ns | LARGE | |

Fig.19

(CASE OF DELAY QUANTITY ADJUSTMENT OF FINE INTERVAL BY 0.2ns)

| DELAY CONTROL SIGNAL B 4 3 2 1 | INPUT SIGNAL TO DELAY ELEMENT FA | DELAY QUAN -TITY | DELAY | INPUT SIGNAL TO DELAY ELEMENT FB | DELAY QUAN -TITY | DELAY | ENABLE |
|---|---|---|---|---|---|---|---|
| 0 0 0 0 | 1 1 1 | +0.0ns | SMALL ↑ | 0 0 0 | +1.4ns | LARGE ↑ | 1 |
| 0 0 0 1 | 1 1 0 | +0.2ns | | 0 0 1 | +1.2ns | | |
| 0 0 1 0 | 1 0 1 | +0.4ns | | 0 1 0 | +1.0ns | | |
| 0 0 1 1 | 1 0 0 | +0.6ns | | 0 1 1 | +0.8ns | | |
| 0 1 0 0 | 0 1 1 | +0.8ns | | 1 0 0 | +0.6ns | | |
| 0 1 0 1 | 0 1 0 | +1.0ns | | 1 0 1 | +0.4ns | | |
| 0 1 1 0 | 0 0 1 | +1.2ns | | 1 1 0 | +0.2ns | | |
| 0 1 1 1 | 0 0 0 | +1.4ns | LARGE | 1 1 1 | +0.0ns | SMALL | |
| 1 1 1 1 | 0 0 0 | +1.4ns | LARGE ↑ | 1 1 1 | +0.0ns | SMALL ↑ | 0 |
| 1 1 1 0 | 0 0 1 | +1.2ns | | 1 1 0 | +0.2ns | | |
| 1 1 0 1 | 0 1 0 | +1.0ns | | 1 0 1 | +0.4ns | | |
| 1 1 0 0 | 0 1 1 | +0.8ns | | 1 0 0 | +0.6ns | | |
| 1 0 1 1 | 1 0 0 | +0.6ns | | 0 1 1 | +0.8ns | | |
| 1 0 1 0 | 1 0 1 | +0.4ns | | 0 1 0 | +1.0ns | | |
| 1 0 0 1 | 1 1 0 | +0.2ns | ↓ | 0 0 1 | +1.2ns | ↓ | |
| 1 0 0 0 | 1 1 1 | +0.0ns | SMALL | 0 0 0 | +1.4ns | LARGE | |

DELAY ADJUSTMENT CIRCUIT FOR DELAY LOCKED LOOP

BACKGROUND OF THE INVENTION

1. Field of the Invention

The present invention relates to a delay adjustment circuit for a delay locked loop. More particularly, the invention relates to a delay adjustment circuit for a delay locked loop, which is mainly loaded between semiconductor integrated circuits of clock synchronous types or the like, applied to a delay locked loop for synchronizing an internal clock signal used at an internal circuit based on an external control signal with an external clock signal, and provided with functions of adjusting a delay quantity of a rough interval, and adjusting a delay quantity of a fine interval.

2. Description of the Prior Art

It is a known fact that information electronic devices such as a portable telephone set have widely been used in recent years. It is also well known that many of the information electronic devices generate internal clock signals to be used at their internal circuits based on external control signals.

It is generally known that a delay locked loop (abbreviated to DLL, hereinafter) is used in order to synchronize the internal clock signals used at the internal circuits with external clock signals based on the above external control signals.

A DLL delay adjustment circuit has conventionally been provided, which is applied to the DLL for synchronizing the internal clock signals used at the internal circuits with the external clock signals based on the external control signals, and provided with functions of adjusting a delay quantity of a rough interval, and a delay quantity of a fine interval. It is well known that in this DLL delay adjustment circuit, with a higher speed and lower power consumption requested of the semiconductor integrated circuit in recent years, allowable ranges of various standards such as an output delay error (jitter) have tended to become very narrow.

FIG. 1 is a circuit block diagram schematically showing a basic configuration of a conventional DLL delay adjustment circuit.

The conventional DLL delay adjustment circuit 100 is configured by serially connecting a plurality (three in this case) of first delay elements D1 to D3 having maximum delay values of delay quantity adjustment of a fine interval to a selection circuit (selector) S. This conventional DLL delay adjustment circuit 100 is configured in such a manner that a second delay element FA for adjusting a delay quantity of a fine interval is connected to an output side of the selection circuit S, input clock signals CLK-IN are entered to the delay elements D1 to D3, and the selection circuit S, and accordingly delay outputs obtained from the delay elements D1 to D3 are respectively entered to the selection circuit S.

Also, the conventional DLL delay adjustment circuit 100 is configured in such a manner that delay outputs obtained from the delay elements D1 to D3 are set as a delay quantity of a rough interval, first delay. control signals A1 and A2 for selection control are entered to the selection circuit S from an external unit, and second delay control signals B1, B2, B3 and B4 for setting a delay quantity of a fine interval are entered to the second delay element FA from the external unit.

In the conventional DLL delay adjustment circuit 100, the delay quantity of a fine interval set by the second delay element FA based on the second delay control signals B1, B2, B3 and B4 is added to the delay quantity of a rough interval obtained as an output of roughly adjusted delays from the delay elements D1 to D3 selected by the selection circuit S based on the first delay control signals A1 and A2, and a result of the addition can be obtained as an output clock signal CLK-OUT.

Incidentally, in the DLL delay adjustment circuit 100, the input clock signals CLK-IN and the first delay control signals A1 and A2 entered to the selection circuit S can be considered as a delay quantity rough adjustment input signal system L1 for adjusting a delay quantity of a rough interval, and the second delay control signals B1, B2, B3 and B4 as a delay quantity fine adjustment input signal system L2 for adjusting a delay quantity of a fine interval.

FIG. 2 is a timing chart showing a relation of output waveforms among delay quantity adjustment of a rough interval, delay quantity adjustment of a fine interval, and a last clock total delay quantity by delay quantity adjusting operations thereof in the DLL delay adjustment circuit. It is specifically shown that when delay quantity adjustment of a fine interval is made by 0.2 ns, 1ns being a maximum, delay quantity adjustment of a rough interval is carried out as carrying of the delay quantity adjustment of a fine interval, and an output clock signal CLK-OUT is obtained by a last clock total delay quantity resulted from addition of those delay quantities.

Other conventional technologies have been presented regarding DLL delay adjustment. For example, Japanese Patent A No. 2001-56723 discloses "SEMICONDUCTOR INTEGRATED CIRCUIT". A known technology regarding delay adjustment of a phase locked loop (called PLL) is disclosed as, for example "CONTINUOUSLY ADJUSTABLE DELAY LOCKED LOOP" in Japanese Patent A No. 11 (1999)-168376. Japanese Patent A No. 2000-323969 discloses "DIGITAL PLL APPARATUS AND DELAYLER THEREOF". Moreover, a known technology regarding delay quantity adjustment for general high-speed digital circuit is disclosed as "DELAY ADJUSTMENT CIRCUIT" in Japanese Patent A No. 3 (1991)-35613.

However, in the case of the DLL delay adjustment circuit shown in FIG. 1, for example, in FIG. 3, if a relation between changing points of signals (obtained at input terminal names D1 and D2 on the selection circuit S) obtained by passing of the input clock signal CLK-IN as data at the selection circuit S through the delay elements D1 and D2, and delay control signals A2 ("01" section):A1 ("10" section) as selection signals indicating switching operations for those signals is set in operation by a shown timing, then noise is generated in an output signal (obtained from an output terminal name Y on the section circuit S).

If the delay quantity adjustment described above with reference to FIG. 2 is not operated normally, an output delay error similar to that shown in FIG. 4 occurs in a last clock total delay quantity at the output clock signal CLK-OUT. That is, in FIG. 4, if delay quantity adjustment of a rough interval is not operated normally, when a timing of a waveform of delay quantity adjustment of a fine interval related to the delay quantity fine adjustment input signal system L2 is shifted to be delayed from a waveform of a delay quantity adjustment of a rough interval related to the delay quantity rough adjustment input signal system L1 (when timings of selection of the delay quantity adjustment of a fine interval and selection of the delay quantity adjustment of a rough interval are not identical to each other), the output clock signal CLK-OUT is obtained while output delay errors of 1 ns and 2 ns occur in the last clock total delay quantity.

In order to deal with the noise generated in the output of the selection circuit S and the output delay error generated in the output clock signal CLK-OUT of the delay element FA, all the delay control signals A1, A2, and B1 to B4 can be controlled by retiming with the output clock signal CLK-OUT. In this case, however, time for retiming must be secured in a period from the output of the selection circuit S to obtaining of the output clock signal CLK-OUT of the delay element FA. Consequently, a significant adverse effect is placed on maintenance of a high-speed operation.

In short, in the case of the conventional DLL delay adjustment circuit, because of a functional configuration, it is difficult to achieve a high-speed operation after prevention of noise generation or output delay error generation during switching by delay control signals.

SUMMARY OF THE INVENTION

An object of the present invention is to eliminate the foregoing drawbacks of the conventional art, and its technical task is to provide a DLL delay adjustment circuit capable of achieving a high-speed operation after prevention of noise generation or output delay error generation during switching by delay control signals.

In accordance with the present invention, a delay adjustment circuit for a delay locked loop comprises: a delay rough adjustment circuit unit for carrying out delay quantity adjustment of a rough interval, the circuit unit including first delay elements having a maximum delay value of delay quantity adjustment of an interval finer than the rough interval, and divided into two systems of odd-number and even-number stages to carry out delay quantity adjustment of the rough interval with respect to an input clock signal, and selection circuits for receiving first delay control signals from an external unit to select and control delay outputs obtained from the first delay elements as delay quantities of the rough interval, and dividing the first delay elements into the two systems of the odd-number and even-number stages; and a delay fine adjustment circuit unit including second delay elements of two systems for receiving outputs of roughly adjusted delays of the odd-number and even-number stages of the two systems, selectively carrying out fine interval delay quantity adjustments of the two systems by opposite operations, and obtaining the output clock signal. In this case, the delay fine adjustment circuit unit adds a delay quantity of a fine interval set by the second delay elements to a delay quantity of a rough interval obtained as an output of the roughly adjusted delay from the first delay elements selected by the selection circuits based on the first delay control signal, and outputs a result of the addition as the output clock signal based on the second delay control signals. The first delay control signals are separately transmitted to the selection circuits of the odd-number and even-number stages to select delay outputs of the plurality of first delay elements, and control is executed to switch outputs of roughly adjusted delays of the two systems when delay differences of fine interval delay quantity adjustments between the two systems become equal to each other.

In accordance with the present invention, the delay adjustment circuit for a delay locked loop can employ various proper modes descried below.

That is, in the delay adjustment circuit for a delay locked loop according to the invention, the delay rough adjustment circuit unit includes a plurality of delay selection circuits provided with selection functions by the selection circuits of the odd-number and even-number stages, and fine interval delay quantity adjusting functions by the plurality of first delay elements. The delay selection circuits of the odd-number and even-number stages are configured by combining and connecting first delay selection circuits operated for output according to a HIGH level signal from an external unit based on the input clock signal, second delay selection circuits operated for output according to the first delay control signals based on the input clock signal, and third delay selection circuits operated for output according to a LOW level signal from the external unit.

The delay adjustment circuit for a delay locked loop according to the invention further comprises an output selection circuit for selectively outputting one of inputs of output clock signals outputted from the second delay elements of the two systems based on an enable signal from an external unit generated in synchronization with the second delay control signals.

In the delay adjustment circuit for a delay locked loop according to the invention, the second delay elements of the two systems selectively switch output operations based on an enable signal from an external unit generated in synchronization with the second delay control signals.

In the delay adjustment circuit for a delay locked loop according to the invention, for the enable signal, one of normal rotation is transmitted to one of the second delay elements of the two systems, and one of reverse rotation is transmitted to the other. For the second delay control signals, one of reverse rotation is transmitted to one of the second delay elements of the two systems, and one of normal rotation is transmitted to the other.

In the delay adjustment circuit for a delay locked loop according to the invention, the second delay elements of the two systems switch output operations based on gray codes transmitted as the second delay control signals.

In the delay adjustment circuit for a delay locked loop according to the invention, the second delay elements of the two systems switch output operations based on binary codes transmitted as the second delay control signals.

BRIEF DESCRIPTION OF THE DRAWINGS

FIG. 7 is a timing chart showing waveforms of a delay control signal and an enable signal generated by the control signal generation circuit shown in FIG. 6 and entered to the DLL delay adjustment circuit of the first embodiment of the invention shown in FIG. 5.

FIG. 8 is a numerical control correspondence table showing a specific operation of delay quantity adjustment by a delay control signal and an enable signal in the DLL delay adjustment circuit of the first embodiment of the invention shown in FIG. 5.

FIG. 17 is a numerical control correspondence table showing a specific operation of delay quantity adjustment based on a gray code delay control signal in the DLL delay adjustment circuit shown in FIG. 16.

FIG. 19 is a numerical control correspondence table showing a specific operation of delay quantity adjustment based on a binary code delay control signal in the DLL delay adjustment circuit shown in FIG. 18.

DETAILED DESCRIPTION OF THE PREFERRED EMBODIMENTS

Next, detailed description will be made of the preferred embodiments of DLL delay adjustment circuits of the present invention with reference to the accompanying drawings.

First Embodiment

Figure 5:
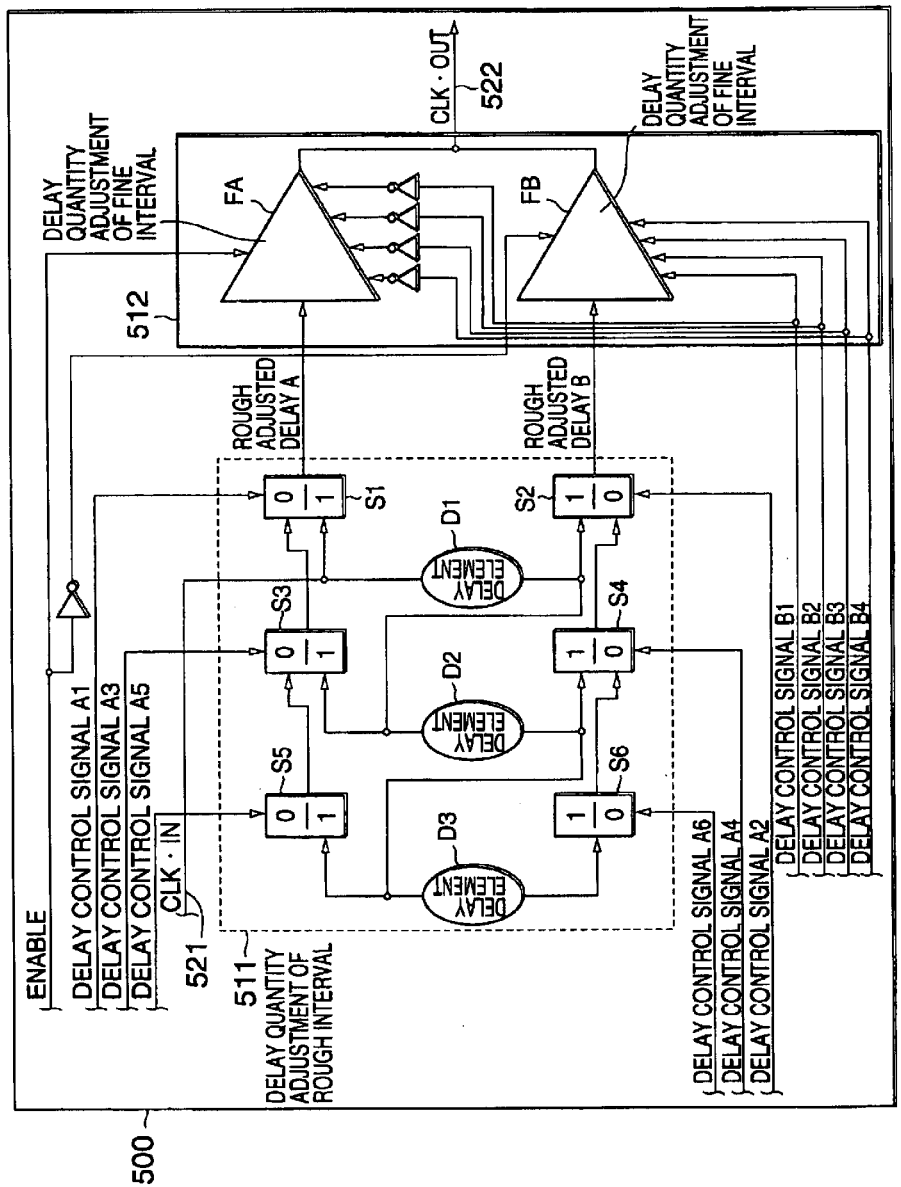
FIG. 5 is a circuit block diagram schematically showing a basic configuration of a DLL delay adjustment circuit according to a first embodiment of the present invention.

FIG. 5 is a circuit block diagram schematically showing a basic configuration of a DLL delay adjustment circuit according to the first embodiment of the present invention.

A DLL delay adjustment circuit 500 of the first embodiment of the present invention comprises a delay rough adjustment circuit unit 511 for making delay quantity adjustment of a rough interval, and a delay fine adjustment circuit unit 512 for making delay quantity adjustment of a fine interval. The delay rough adjustment circuit unit 511 is constructed in such a manner that totally six selection circuits (selectors) S1 to S6 are connected to a plurality (also three in this case) of interconnected first delay elements D1 to D3 having a maximum delay value of delay quantity adjustment of a fine interval with respect to an input clock signal CLK-IN so as to be divided into two systems of odd-number and even-number stages and, through the selection circuits S1, S3a and S5 of the odd-number stage and the selection circuits S2, S4 and S6 of the even-number stage, outputs of roughly adjusted delays A and B of the two systems are obtained to be selected from the selected ones of the first delay elements D1 to D3, in which a difference in delays as delay quantity adjustment of a rough interval indicates a maximum delay value of delay quantity adjustment of a fine interval. The delay fine adjustment circuit unit 512 includes second delay elements FA and FB for the two systems, which are provided to receive the outputs of the roughly adjusted delays A and B of the two systems, and perform opposite operations to make fine interval delay quantity adjustments of the two systems to be selected, thereby obtaining an output clock signal CLK-OUT 522.

First delay control signals A1, A3 and A5, and first delay control signals A2, A4 and A6 are separately transmitted to the selection circuits S1, S4 and S5 of the odd-number stage and the selection circuits S2, S4 and S6 of the even-number state in the delay rough adjustment circuit unit 511. This transmission is carried out in such a way as to select delay outputs of the first delay elements D1 to D3 from an external unit, and control switching of the outputs of the two-system roughly adjusted delays A and B when delay differences of fine interval delay quantity adjustments of the two systems become equal to each other in the delay fine adjustment circuit unit 512.

That is, the first delay control signals A12 to A6 basically serve as selection signals for selecting the selection circuits S1 to S6. The first delay elements D1 to D3 are connected to the delay rough adjustment circuit unit 511 such that a delay difference between the output of the roughly adjusted delay A from the selection circuits S1, S3 and S5 of the odd-number stage and the output of the roughly adjusted delay B from the selection circuits S2, S4 and S6 of the even-number stage can be equal to a maximum delay value of delay quantity adjustment of a fine interval.

Second delay control signals B1 to B4 for setting a delay quantity of a fine interval from the external unit, and an enable signal ENABLE (signal for deciding connection or unconnection outputs of fine delay quantity adjustments of the second delay elements FA and FB) generated in synchronization with the control signals B1 to B4 to switch and select output operations are transmitted to the second delay elements FA and FB in the delay fine adjustment circuit unit 512. After connection of output sides of the second delay elements FA and FB to each other, the output clock signal CLK-OUT 522 is obtained. In this case, however, for the enable signal ENABLE, a signal of a normal rotation state is transmitted to one of the second delay elements FA and FB, i.e., the FA, and a signal of a reverse rotation state to the other delay element FB. For the second delay control signals B1 to B4, a signal of a reverse rotation state is transmitted to one of the second delay elements FA and FB, i.e., the FB, and a signal of a normal rotation state to the other second delay element FB. The second delay elements FA and FB are similar in configuration. However, to perform opposite operations, the second delay control signals B1 to B4 of normal rotation states are transmitted to the second delay element FB, and those of reverse rotation states to the second delay element FA. Accordingly, for bit connections, for example if connections for the second delay element FB are 1 to 4, then those for the second delay element FA are 4 to 1.

That is, in the DLL delay adjustment circuit 500 of the first embodiment of the present invention, the delay rough adjustment circuit unit 511 is configured in the following manner. The pair of selection circuits S1 and S2, and the first delay element D2 are connected to the first delay element D1, the pair of selection circuits S3 and S4, and the first delay element D3 to the first delay element D2, and the pair of selection circuits S5 and S6 to the first delay element D3. Then, an input clock signal is entered sequentially to the selection circuits S1 and S2, the selection circuits S3 and S4, and the selection circuits S5 and S6 through the first delay elements D1 to D3. Accordingly, delay outputs obtained from the first delay elements D1 to D3 can be entered respectively to the selection circuits S1, S3 and S5 of the odd-number stage, and the selection circuits S2, S4 and S6 of the even-number stage. The first delay control signals A1 to A6 for selecting and controlling the delay outputs obtained from the first delay elements D1 to D3 as a delay quantity of a rough interval are separately entered to the selection circuits S1, S3 and S5 of the odd-number stage and the selection circuits S2, S4 and S6 of the even-number stage from the external unit, as dedicated delay control signals A1, A3 and A5, and dedicated delay controls signals A2, A4 and A6. The delay outputs obtained from the-first delay elements D1 to D3 interconnected to make rough interval delay quantity adjustment are connected 1:1 to the selection circuits S1, S3 and S5 of the odd-number stage and the selection circuits S2, S4 and S6 of the even-number stage so as to be selected. Accordingly, an output of a roughly adjusted delay can be obtained from the selection circuits S1, S3 and S5 of the odd-number stage, and an output of a roughly adjusted delay B from the selection circuits S2, S4 and S6 of the even-number stage. The delay fine adjustment circuit unit 512 is configured in the following manner. The second delay element FA for making fine interval delay quantity adjustment is connected to the output side of the roughly adjusted delay A related to the selection circuits S1, S3 and S5 of the odd-number stage, and the second delay element FB for making fine interval delay quantity adjustment to the output side of the roughly adjusted delay B related to the selection circuits S2, S4 and S6 of the even-number stage. Then, the second delay control signals for setting a fine interval delay quantity are entered to the second delay elements FA and GB of the two systems from the external unit (signals of normal rotation are transmitted to the second delay element FB, and signals of reverse rotation to the second delay element FA). Enable signals ENABLE synchronized with the second delay control signals B1 to B4 to switch and select output operations are entered (signals of normal rotation are transmitted to the second delay element FA, and signals of reverse rotation to the second delay element FB). Accordingly, a delay quantity of a rough interval is obtained as outputs of the roughly adjusted delays A and B related to the delay outputs of the first delay elements D1 to D3 selected and outputted form the selection circuits S1, S3 and S5 of the odd-number stage, and the selection circuits S2, S4 and S6 of the even-number stage by the first delay control signals A1, A3 and A5 and the first delay control signals A2, A4 and A6. A delay quantity of a fine interval is set at the second delay elements FA and FB by the second delay control signals B1 to B4, and obtained by the switching operation of the second delay elements FA and FB by the enable signal ENABLE. Then, a result of addition of the latter to the former can be obtained as an output clock signal CLK-OUT 522.

In the case of the DLL delay adjustment circuit 500 constructed in the foregoing manner, the outputs of the two-system roughly adjusted delays A and B selectively obtained from the selection circuits S1, S3 and S5 of the odd-number stage and the selection circuits S2, S4 and S6 of the even-number stage are selectively connected to the fine interval delay quantity adjustment of the two systems for performing different operations in the delay fine adjustment circuit unit 512. In this basic operation, when the delay differences of the fine interval delay quantity adjustments of the two systems become equal to each other in the delay fine adjustment circuit unit 512, the outputs of the two-system roughly adjusted delays A and B obtained from the selection circuits S1, S3 and S5 of the odd-number stage and the selection circuits S2, S4 and S6 of the even-number stage are switched and controlled by the first delay control signals A1, A3 and A5 and the first delay control signals A2, A4 and A6. Accordingly, delay quantity adjustment of a rough interval can be carried out only in the side of the delay fine adjustment circuit unit 512, in which switching by the second delay elements FA and FB is not selected. Therefore, no noise problems occur because even if noise is generated during switching, the noise is not outputted, and it is not necessary to secure time for retiming of a switching timing for preventing noise generation during switching, which has limited a high-speed operation, thereby achieving a high speed.

As a result, a delay difference during switching in fine interval delay quantity adjustment of the two systems can be eliminated, and a switching timing condition of rough interval delay quantity adjustment can be relaxed. Thus, it is possible to achieve a high-speed operation after prevention of noise generation or output delay error generation during switching by delay control signals.

Figure 6:
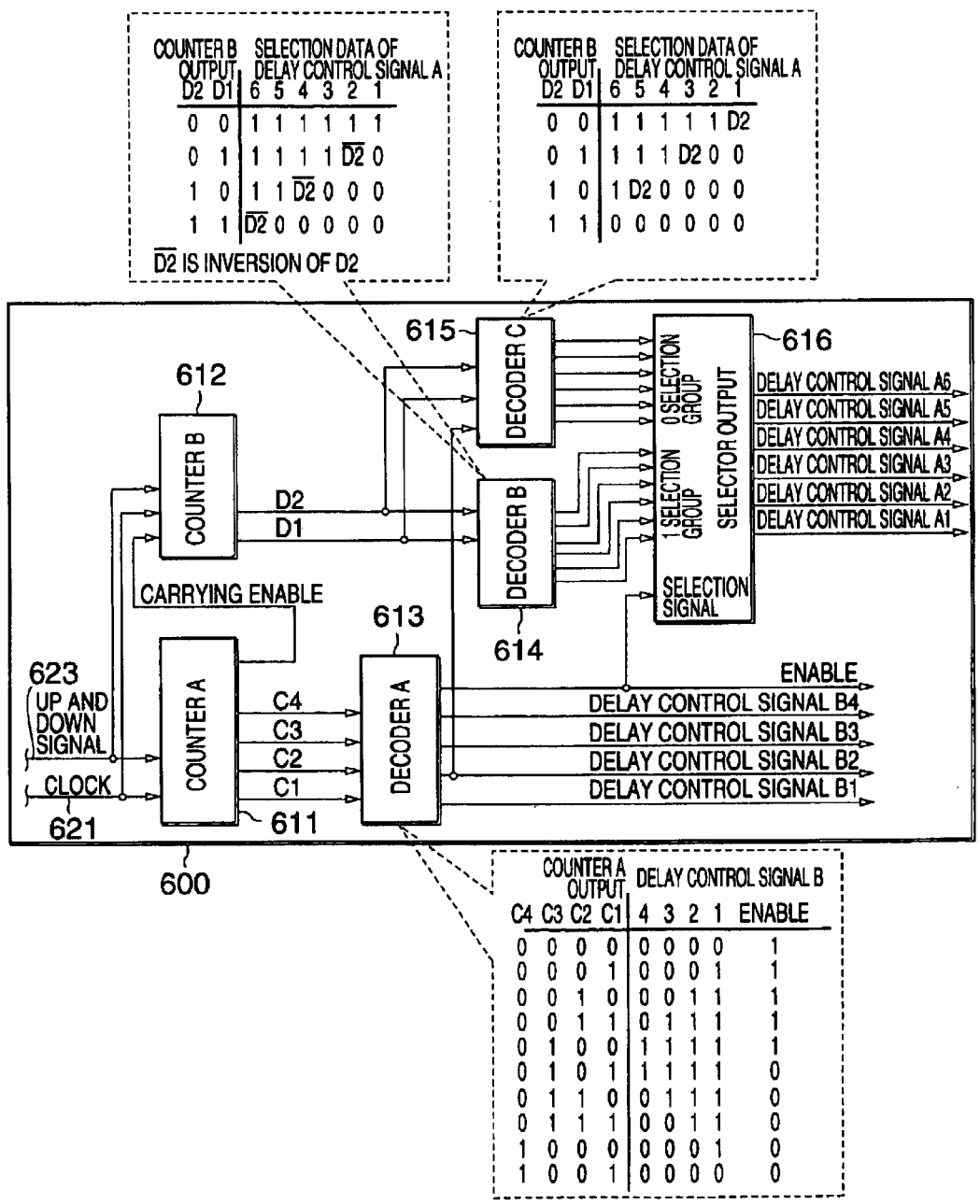
FIG. 6 is a circuit block diagram showing a basic configuration and specific functions of a control signal generation circuit for generating a delay control signal and an enable signal entered to the DLL delay adjustment circuit of the first embodiment of the invention shown in FIG. 5.

FIG. 6 is a circuit block diagram showing a basic configuration and specific functions of a control signal generation circuit 600 for generating delay control signals (first delay control signals A1 to A6, and second delay control signals B1 to B4) and an enable signal ENABLE entered to the DLL delay adjustment circuit 500.

The control signal generation circuit 600 is constructed in the following manner. That is, in counters A611 and B612 of two systems disposed in an initial stage to receive a predetermined clock (signal) 621 and up-and-down (UP, DOWN) signal 623, outputs C1 to C4 of four systems are obtained from the counter A611, a carrying enable (signal) is outputted to the counter B612, and outputs D1 and D2 of two systems are obtained from the counter B612. In decoders A613, B614 and C615 of three systems disposed in a middle stage, at the decoder A613, second delay control signals B1 to B4 and an enable signal ENABLE are generated and outputted according to four-system outputs C1 to C4 of the counter A611. At the decoder B614, selector data (containing one of a reverse rotation state) of one of six systems is generated and outputted for the purpose of generating first delay control signals A1 to A6 of the six systems according to the two-system outputs D1 and D2 of the counter B612. At the counter C615, selector data of the other of the six systems is generated and outputted for the purpose of generating first delay control signals A1 to A6 of the six systems according to two-system outputs D1 and D2 of the counter B612, and the second delay control signal B2 of the decoder A613. Further, at a selector 616 disposed in a rear stage, the selector data of one of the six systems from the decoder B614 is set as a 1 selection group, and the selector data of the other of the six systems from the decoder C615 as a 0 selection group. Then, for these respective inputs, first delay control signals A1 to 16 of six systems are generated and outputted according to an input of the enable signal as a selection signal from the decoder A613.

Hereinafter, detailed description is made of a basic operation of the DLL delay adjustment circuit 500 of the first embodiment with reference to FIGS. 7 to 10. FIG. 7 is a timing chart showing delay control signals (first delay control signals A1 to A6, and second delay control signals B1 to B4), and an enable signal ENABLE, FIG. 8 a numerical control correspondence table showing a specific operation of delay quantity adjustment by the delay control signals (first delay control signals A1 to A6, and second delay control signals B1 to B4), and the enable signal ENABLE (in this case, delay quantity adjustment of a rough interval is carried out by 1.0 ns, and delay quantity adjustment of a fine interval by 0.2 ns), FIG. 9 an expanded view of circuit main portions illustrating a control operation in the delay quantity adjustment of a rough interval shown in FIG. 9, and FIG. 10 a timing chart showing a relation of waveforms among the delay control signals (second delay control signals B1 to B4), the enable signal ENABLE, rough interval delay quantity adjustments of two systems (outputs of roughly adjusted delays A and B), fine interval delay quantity adjustments (outputs of second delay elements FA and FB), and a last clock total delay quantity by delay quantity adjusting operations thereof (also in this case, fine interval delay quantity adjustment is carried out by 0.2 ns, ins being a maximum).

First, in the DLL delay adjustment circuit 500, if initial setting is a shortest delay, the first delay control signals A1 to A6 are all set to "1", the second delay control signals B1 to B4 all to "0", and the enable signal ENABLE to "0". In this case, in a delay operation of fine interval delay quantity adjustment, the second delay element FA becomes minimum, and the second delay element FB maximum as shown in the numerical control correspondence table of FIG. 8. In this case, on the circuit, an input clock signal CLK-IN is selected by the selection circuit S1, thereby obtaining an output of a roughly adjusted delay A. As a result of selecting fine interval delay quantity adjustment by the second delay element FA with respect to the output of the roughly adjusted delay A, a connection is set to obtain an output clock signal CLK-OUT (i.e., connection of CLK-IN→S1→FA→CLK-OUT), realizing a shortest delay operation.

It is now assumed that as a control timing of delay quantity adjustment of a rough interval, an input clock signal CLK-IN is selected by the selection circuit S2 related to the first delay element D1, thus outputting a roughly adjusted delay B, delay quantity adjustment of a fine interval is selected by the second delay element FB for the output of this roughly adjusted delay B and, as a result, a connection is set to obtain an output clock signal CLK-OUT (i.e., connection of CLK-IN→D1→S2→FB→CLK-OUT). If a delay quantity of the second delay element FB tends to be delayed, as a connection of the unconnected second delay elements FA side, the input clock signal CLK-IN is first selected at the selection circuit S3 side related to the first delay element D2 connected to the first delay element D1, then reselected by the selection circuit S1, thus outputting a roughly adjusted delay A, and delay quantity adjustment of a fine interval is selected by the second delay element FA for the output of the roughly adjusted delay A. As a result, a connection is set to obtain an output clock signal CLK-OUT (i.e., connection of CLK-IN→D1→S3→S1→FA→CLK-OUT). Conversely, if a delay quantity of the second delay element FB tends to be fast, an input clock signal CLK-IN is selected by the selection circuit S1 to obtain a roughly adjusted delay A, and delay quantity adjustment of a fine interval is selected by the second delay element FA for the output of the roughly adjusted delay A. As a result, a connection is set to obtain an output clock signal CLK-OUT (i.e., connection of CLK1→S1→FA→CLK-OUT). For this purpose, a connection pattern is changed and, for connection, the connection of the rough interval delay quantity adjustment of the side unconnected to the fine interval delay quantity adjustment is switched beforehand during the delay quantity adjustment of a fine interval. The timing chart of FIG. 7 shows a timing in such a case. However, "0" indicating a case other than the bit connections 1 to 4 of the second delay control signals B1 to B4 is schematically shown in FIG. 5, but carried out by another signal system (second delay control signal B5) shown in FIG. 9.

Figure 9:
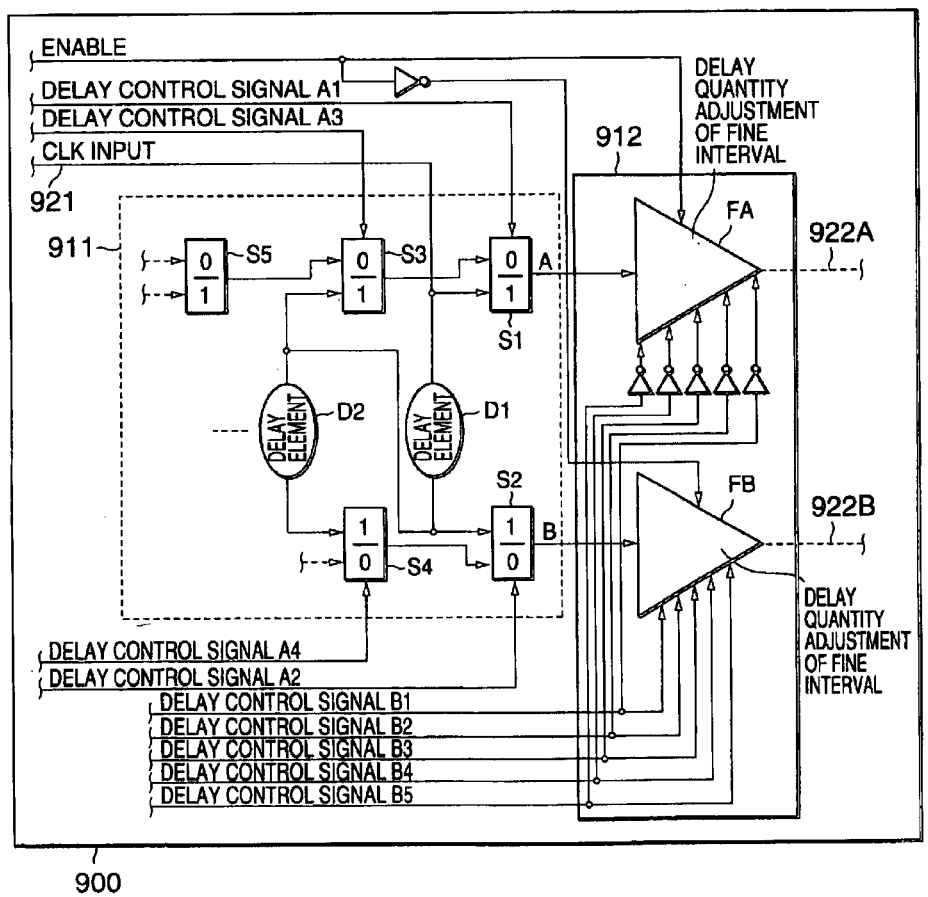
FIG. 9 is an expanded view of circuit main portions illustrating a control operation in delay quantity adjustment of a rough interval in the DLL delay adjustment circuit of the first embodiment of the invention shown in FIG. 5.

Now, description is made by referring to the circuit main portions shown in FIG. 9. It is assumed that an enable signal ENABLE is at a LOW level "0", and an output of a roughly adjusted delay B from the selection circuit S2 is "0" in operation of fine interval delay quantity adjustment by the second delay element FB. If a tendency is for fast by a second delay control signal B3="0", a first delay control signal A="0" and a first delay control signal A="1" are set. If a tendency is for delay by a second delay control signal B3="1", a first delay control signal A1="0" and a first delay control signal A3="0" are set. It is assumed that an enable signal ENABLE is at a HIGH level "1", and an output of a roughly adjusted delay A from the selection circuit S3 is "1" in operation of fine interval delay quantity adjustment by the second delay element FA is "1". If a tendency is for fast by a second delay control signal B3="0", a first delay control signal A2="0" and a first delay control signal A4="1" are set. If a tendency is for delay by a second delay control signal B3="1", a first delay control signal A2="0" and a first delay control signal A="0" are set.

Further, for making delay quantity adjustment in fluctuation by the second delay control signals B1 to B4, if an enable signal ENABLE is "1" and "1" is inserted into the second delay control signals B1 to B4 as shown in FIG. 8, a delay quantity of the second delay element FA for making delay quantity adjustment of a fine interval is enlarged, while a delay quantity of the second delay element FB is reduced. Accordingly, delay values of the second delay elements FA and FB having a delay difference equal to a maximum delay value of fine interval delay adjustment approach each other. When a delay of the second delay element FA is large, and a delay of the second delay element FB small, both delays being repeats of delay quantities shown in FIG. 8, a delay difference between connection patterns CLK-IN→S1→FA→CLK-OUT and CLK-IN→D1→S2→FB→CLK-OUT becomes 1 each of delay adjustment of a fine interval. By performing control to switch the connection pattern CLK-IN→S1→FA→CLK-OUT to the connection pattern CLK-IN→D1→S2→FB→CLK-OUT by the enable signal ENABLE at points of no such changes of the second delay control signals B1 to B4, competition in switching times among delay control signals is eliminated. Thus, delay adjustment can be carried on continuously without any effects of noise or the like generated at a timing for switching each delay control signal to obtain an output clock signal CLK-OUT by one signal.

Figure 1:
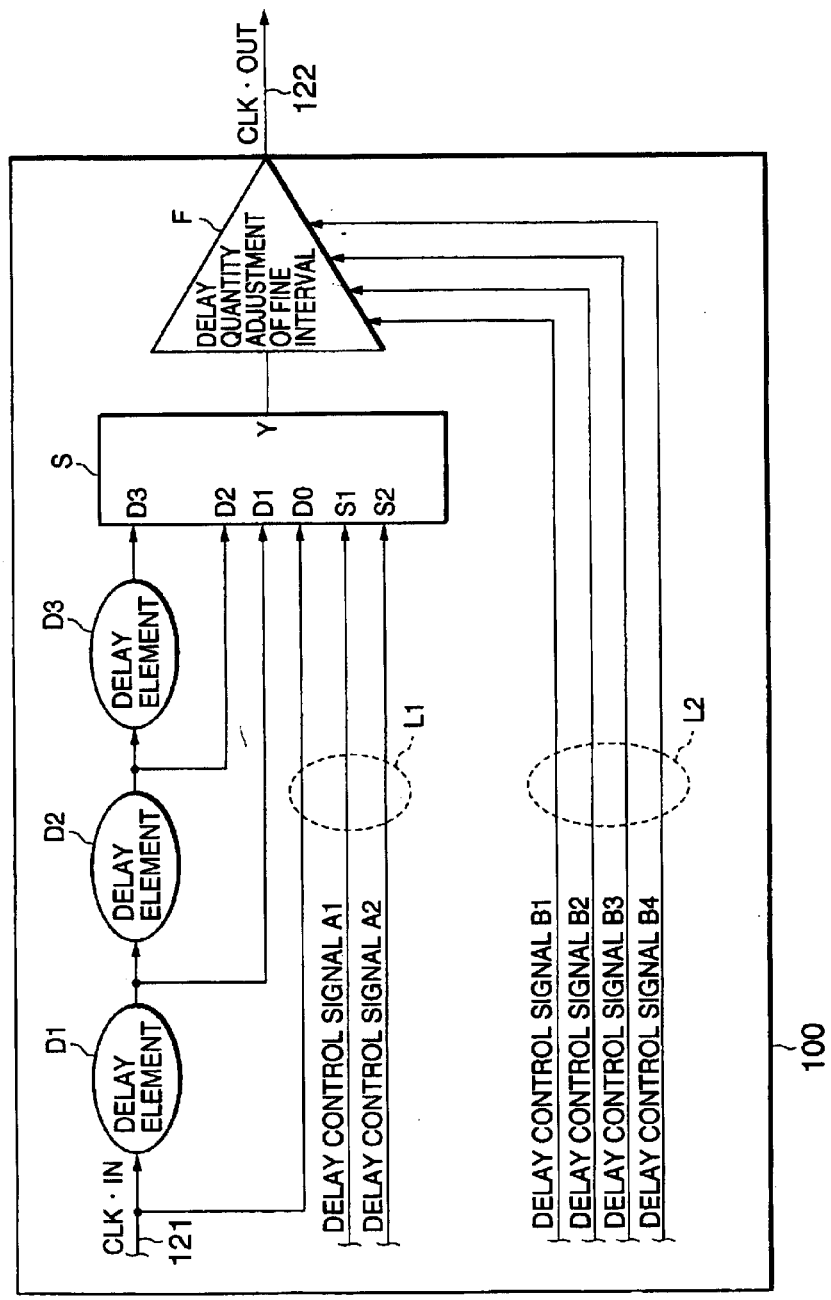
FIG. 1 is a circuit block diagram schematically showing a basic configuration of a conventional DLL delay-adjustment circuit.
Figure 2:
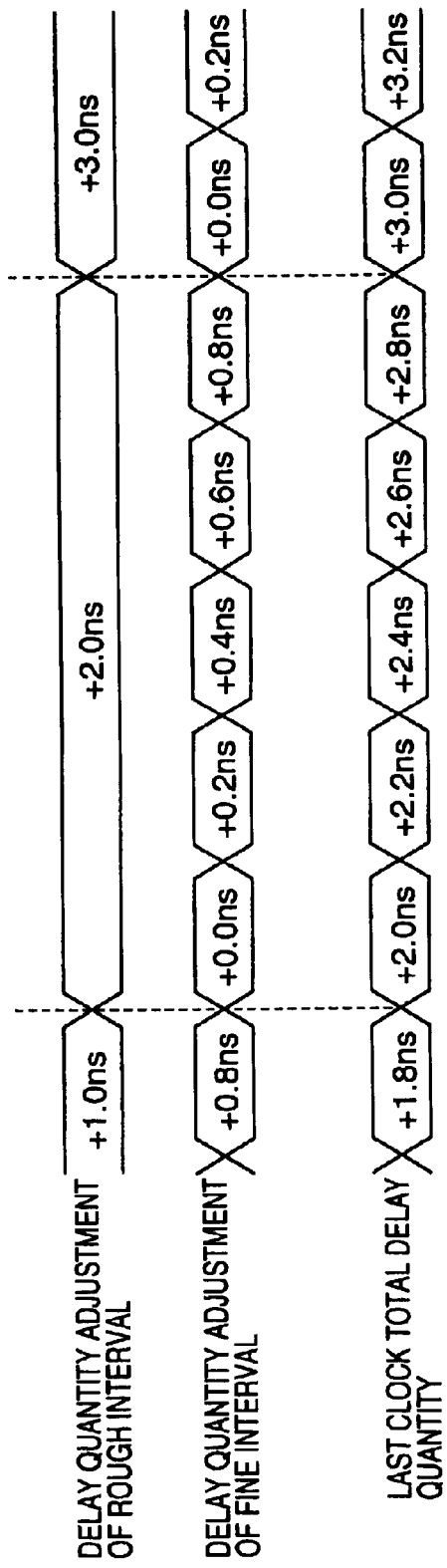
FIG. 2 is a timing chart showing a relation of output waveforms among delay quantity adjustment of a rough interval, delay quantity adjustment of a fine interval, and a last clock total delay quantity by delay quantity adjusting operations thereof in the DLL delay adjustment circuit shown in FIG. 1.
Figure 3:
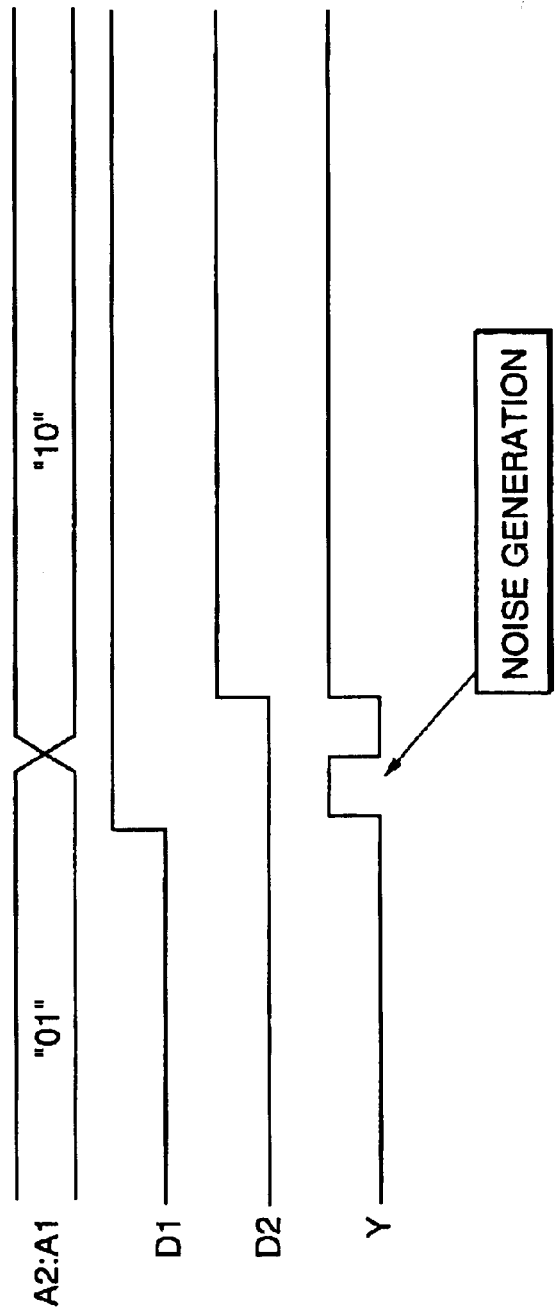
FIG. 3 is a timing chart showing a relation of waveforms among input and output signals when noise is generated in an output from an operation of a selection circuit provided in the DLL delay adjustment circuit shown in FIG. 1.
Figure 4:
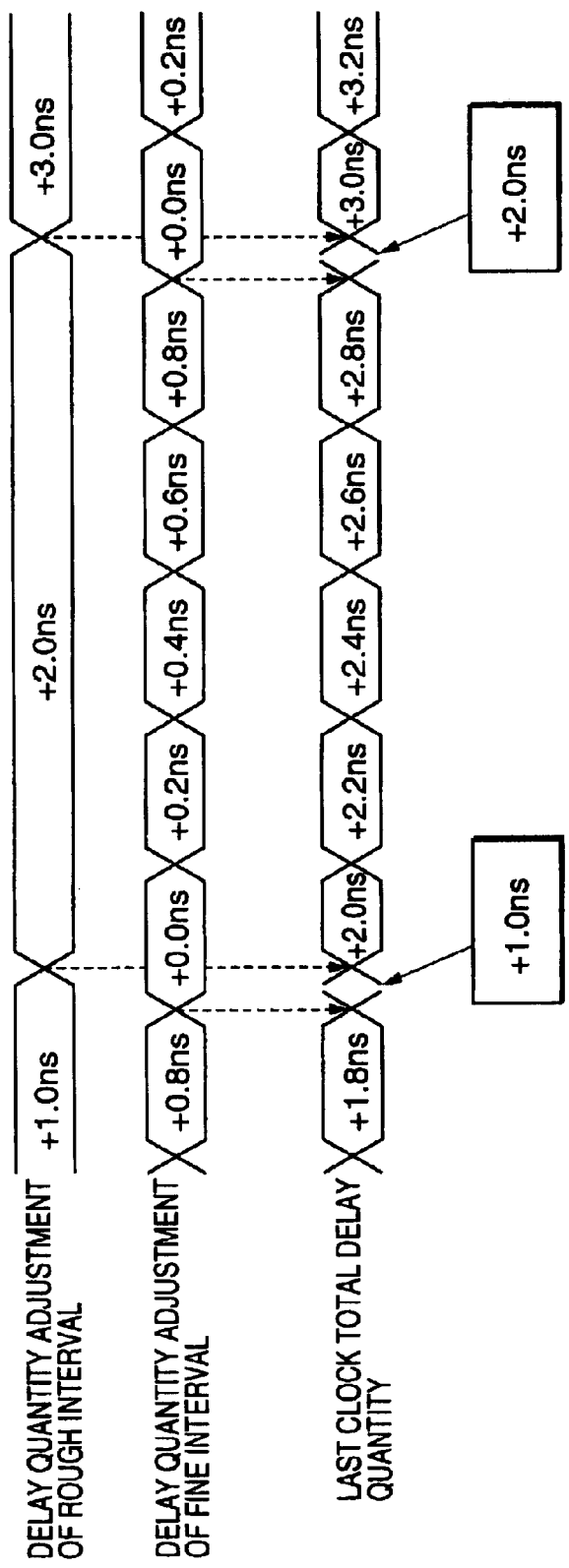
FIG. 4 is a timing chart showing a relation of waveforms among delay quantity adjustment of a rough interval, delay quantity adjustment of a fine interval, and a last clock total delay quantity by delay quantity adjusting operations thereof when the delay quantity adjustment (delay quantity adjustment of a rough interval) of FIG. 2 is not operation normally.
Figure 10:
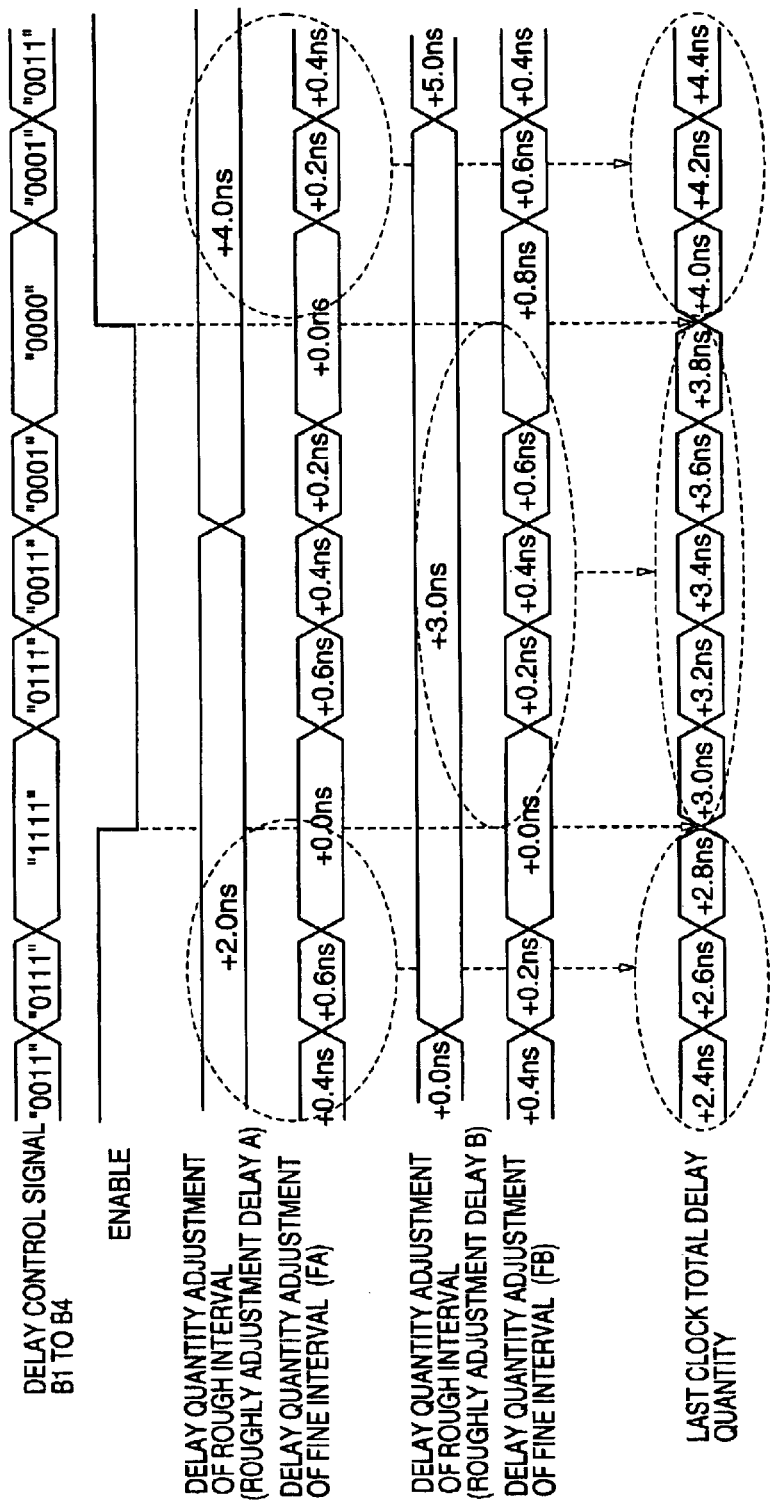
FIG. 10 is a timing chart showing a relation of waveforms among a delay control signal (second delay control signal), an enable signal, rough interval delay quantity adjustment and fine interval delay quantity adjustment of two systems, and a last clock total delay quantity by delay quantity adjusting operations thereof in the DLL delay adjustment circuit of the first embodiment of the invention shown in FIG. 5.

As shown in a timing chart of FIG. 10, by switching the connection patterns by the enable signal ENABLE at points of no changes of the second delay control signals B1 to B4, no noise generation similar to that described above to be difficult to be prevented with reference to FIG. 3 in the case of the conventional DLL delay adjustment circuit shown in FIG. 1 occurs in an output clock signal CLK-OUT having a last clock total delay quantity. This last clock total delay quantity is obtained by adding an output of the second delay element FA for making delay quantity adjustment of a fine interval to an output of delay quantity adjustment (roughly adjusted delay A) of a rough interval, or an output of the second delay element FB for making delay quantity adjustment of a fine interval to an output of delay quantity adjustment (roughly adjusted delay B) of a rough interval. Moreover, a high-speed clock can be dealt with because of no simultaneous occurrence of a switching timing of rough delay quantity adjustment and a switching timing of a fine delay quantity adjustment, and thus an output delay error similar to that described above with reference to FIG. 4 can be suppressed and reduced. Incidentally, even if a frequency band is widened, such functions will have no effects on the switching timing or the shortest delay time.

Therefore, according to the described DLL delay adjustment circuit, in order to adjust a delay quantity of a rough interval by a timing having no effects on the output clock signal CLK-OUT, the selection circuits S1 to S6 are connected to the fired delay elements D1 to D3 to selectively obtain delay outputs thereof by the two systems at the delay rough adjustment circuit unit. These selection circuits S1 to S6 are switched by the first delay control signals A1 to A6 to selectively obtain outputs of the two-system roughly adjusted delays A and B, thereby relaxing the switching timing condition for rough interval delay quantity adjustment. In addition, at the delay fine adjustment circuit unit, the connections of the second delay elements FA and FB of the two systems added to the outputs of the roughly adjusted delays A and B of the two systems to make delay quantity adjustment of a fine interval are switched by the enable signal ENABLE synchronized with the second delay control signals B1 to B4 for setting delay quantities thereof at points of no changes in these signals. Accordingly, the operations are switched to change the connection patterns necessary for the delay quantity adjustments of both rough and fine intervals. Therefore, it is possible to achieve a high-speed operation under the condition of a wide frequency band after prevention of noise generation or output delay error generation during switching by delay control signals, which has been difficult in the conventional circuitry.

Second Embodiment

Figure 11:
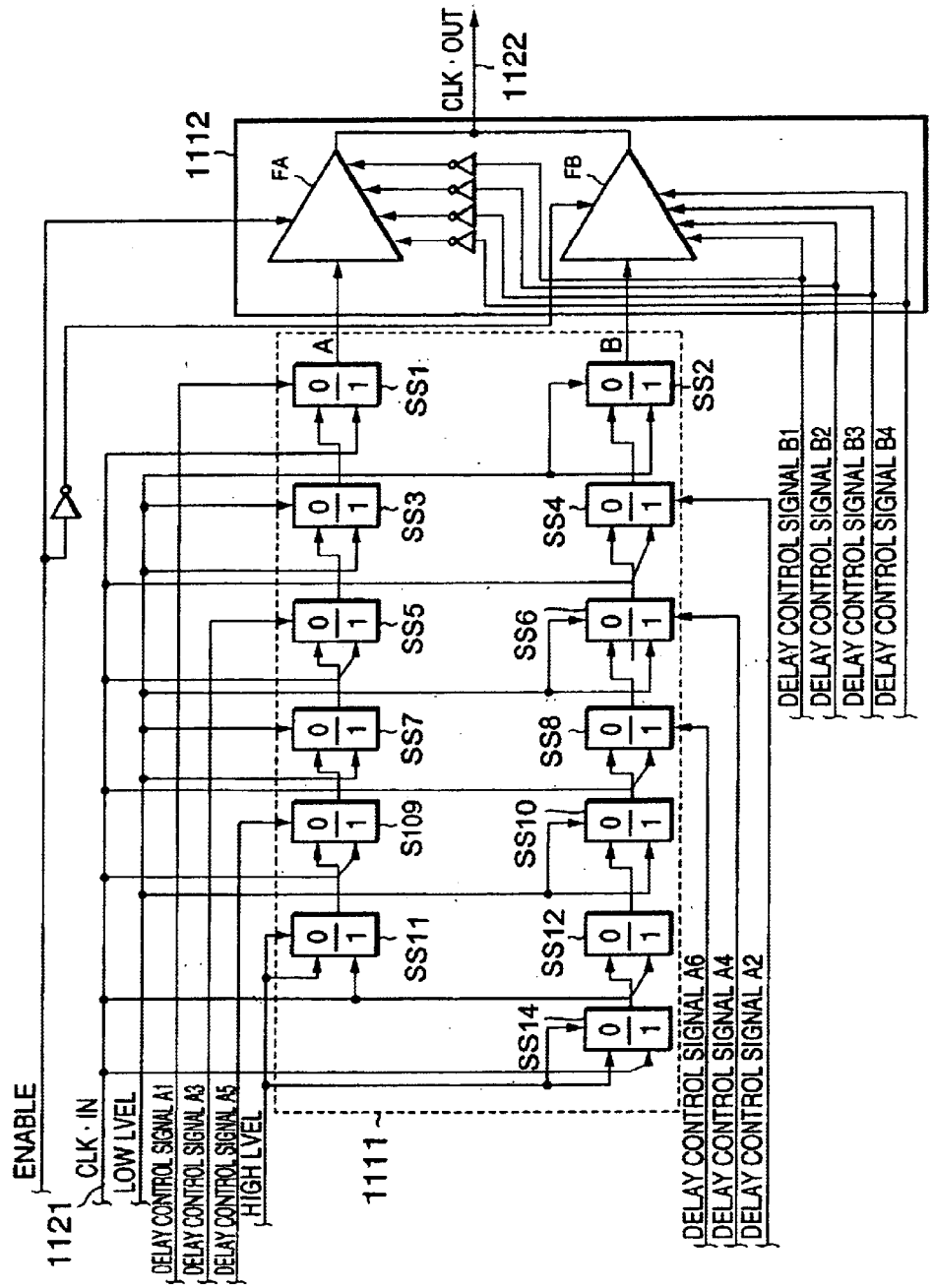
FIG. 11 is a circuit block diagram schematically showing a basic configuration of a DLL delay adjustment circuit according to a second embodiment of the present invention.

FIG. 11 is a circuit block diagram schematically showing a basic configuration of a DLL delay adjustment circuit according to a second embodiment of the present invention. In comparison with the DLL delay adjustment circuit 500 of the first embodiment, a DLL delay adjustment circuit 1100 of the second embodiment of the invention has a changed circuitry of the a delay rough adjustment circuit unit 1111, and comprises a plurality of delay selection circuits SS1 to SS12 and SS14 provided with selection functions by the selection circuits S1, S3 and S5 of the odd-number stage and the selection circuits S2, S4 and S6 of the even-number stage of the first embodiment, and a fine interval delay quantity adjusting function by the first delay elements D1 to D3. The delay selection circuits SS1, SS3, SS5, SS7, SS9 and SS11 of an odd-number stage, and the delay selection circuits SS2, SS4, SS6, SS8, SS10, SS12 and SS14 are respectively configured by combining and connecting the first delay selection circuits SS11 and SS14 operated for output according to a HIGH level signal from an external unit based on an input clock signal CLK-IN, the second delay selection circuits SS1, SS5 and SS9 and the second delay selection circuits SS4, SS8 and SS12 operated for output according to first delay control signals A1, A3 and A5 and first delay control signals A2, A4 and A6 based on the input clock signal CLK-IN, and the third delay selection circuits SS3 and SS7 and the third delay selection circuits SS2, SS6 and SS10 operated for output according to a LOW level signal from the external unit.

Specifically, the delay selection circuits SS1, SS3, SS5, SS7, SS9 and SS1 of the odd-number stage are constructed in such a manner that for the first delay selection circuit SS11 operated for output according to the HIGH level signal from the external unit based on the input clock signal CLK-IN, the second delay selection circuits SS1, SS5 and SS9 operated for output according to the first delay control signals A1, A3 and A5 based on the input clock signal CLK-IN, and the third delay selection circuits SS3 and SS7 operated for output according to the LOW level signal from the external unit are alternately connected to interpose the third delay selection circuits SS3 and SS7 among the second delay selection circuits SS1, SS5 and SS9. The delay selection circuits SS2, SS4, SS6, SS8, SS10, SS12 and SS14 are constructed in such a manner that for the first delay selection circuit SS14 operated for output according to the HIGH level signal from the external unit based on the input clock signal CLK-IN, the second delay section circuits SS4, SS8 and SS12 operated for output according to the first delay control signals A2, A4 and A6 based on the input clock signal CLK-IN, and the third delay selection circuits SS2, SS6 and SS10 operated for output according to the LOW level signal from the external unit are alternately connected to dispose a specified one SS2 of the third delay selection circuits SS2, SS6 and SS10 near the second delay element FB side, and a specified one SS12 of the second delay selection circuits SS4, SS8 and SS12 near the first delay selection circuit SS14 side.

In the case of the DLL delay adjustment circuit of the second embodiment having the above-described changed circuitry of the delay rough adjustment circuit unit, almost similarly to the case of the first embodiment in terms of operation, outputs of roughly adjusted delays A and B of the two systems can be obtained from the delay rough adjustment circuit unit, and operation effects are also similar. Thus, description of specific portions is omitted. According to the second embodiment, however, it is possible to eliminate the necessity of the first embodiment to combine and dispose the first delay elements D1 to D3 and the selection circuits S1 to S6. Therefore, since the types of electronic components necessary in circuitry can be reduced compared with the first embodiment, component management and assembling can be simplified.

Third Embodiment

Figure 12:
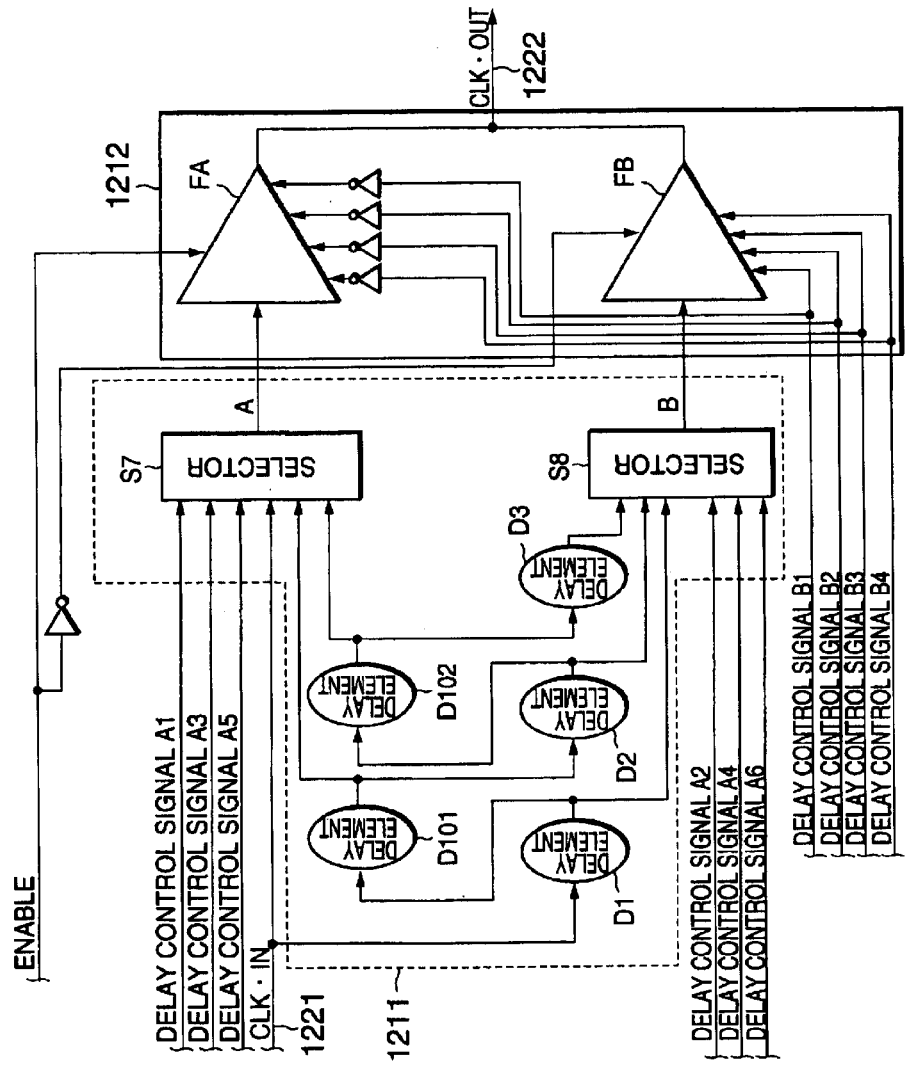
FIG. 12 is a circuit block diagram schematically showing a basic configuration of a DLL delay adjustment circuit according to a third embodiment of the present invention.

FIG. 12 is a circuit block diagram schematically showing a basic configuration of a DLL delay adjustment circuit according to a third embodiment of the present invention. In comparison with the DLL delay adjustment circuit 500 of the first embodiment, a DLL delay adjustment circuit 1200 of the third embodiment has a changed circuitry of the a delay rough adjustment circuit unit, and comprises other first delay elements D101 and D102 added to the three first delay elements D1 to D3 used in the first embodiment, and selection circuits (selectors) S7 and S8 of only two systems of odd-number and even-number stages disposed by simplifying the selection functions by the selection circuits S1, S3 and S5 of the odd-number stage and the selection circuits S2, S4 and S6 of the even-number stage.

Specifically, first, the first delay element D101 and the selection circuit S8 are connected to the output side of the first delay element D1, to which the input clock signal CLK-IN is entered, the first delay element D2 and the selection circuit S7 to the output side of the first delay element D1-1, the first delay element D102 and the selection circuit S8 to the output side of the first delay element D2, the first delay element D3 and the selection circuit S7 to the output side of the first delay element D102, and the selection circuit S8 to the output side of the first delay element D3. Then, first delay control signals A1, A3 and A5 of the odd-number stage, the input clock signal CLK-IN, and outputs of the first delay elements D101 and D102 are combined and entered to selection circuit S7 of the odd-number stage. First delay control signals A2, A4 and A6 of the even-number stage, and outputs of the first delay elements D1, D2 and D3 are combined and entered to the selection circuit S8 of the even-number stage. Because of this circuitry, an output of a roughly adjusted delay A is obtained by selecting delay outputs of the first delay elements D101 and D102 at the selection circuit S7 of the odd-number stage based on the first delay control signals A1, A3 and A5 of the odd-number stage. An output of a roughly adjusted delay B is obtained by selecting delay outputs of the first delay elements D1, D2 and D3 at the selection circuit S8 of the even-number stage based on the first delay control signals A2, A4 and A6 of the even-number stage.

In the case of the DLL delay adjustment circuit of the third embodiment having the above-described changed circuitry of the delay rough adjustment circuit unit, almost similarly to the case of the first embodiment in terms of operation, outputs of roughly adjusted delays A and B of the two systems can be obtained from the delay rough adjustment circuit unit; and operation effects are also similar. Thus, description of specific portions is omitted. According to the second embodiment, however, it is possible to eliminate the necessity of the first embodiment to combine and dispose the first delay elements D1 to D3 and the selection circuits S1 to S6. Rough delay quantity adjustment is carried out by the first delay elements D1 to D3 and the additionally provided first delay elements D101 and D102, delay quantity outputs thereof are ,,, and entered to the simplified selection circuits S7 and S8, and then the roughly adjusted delays A and B are obtained. Therefore, since the number of components for the selection circuits S7 and S8 can be reduced compared with the first embodiment, circuitry and assembling can be simplified in the delay rough adjustment circuit unit.

Fourth Embodiment

Figure 13:
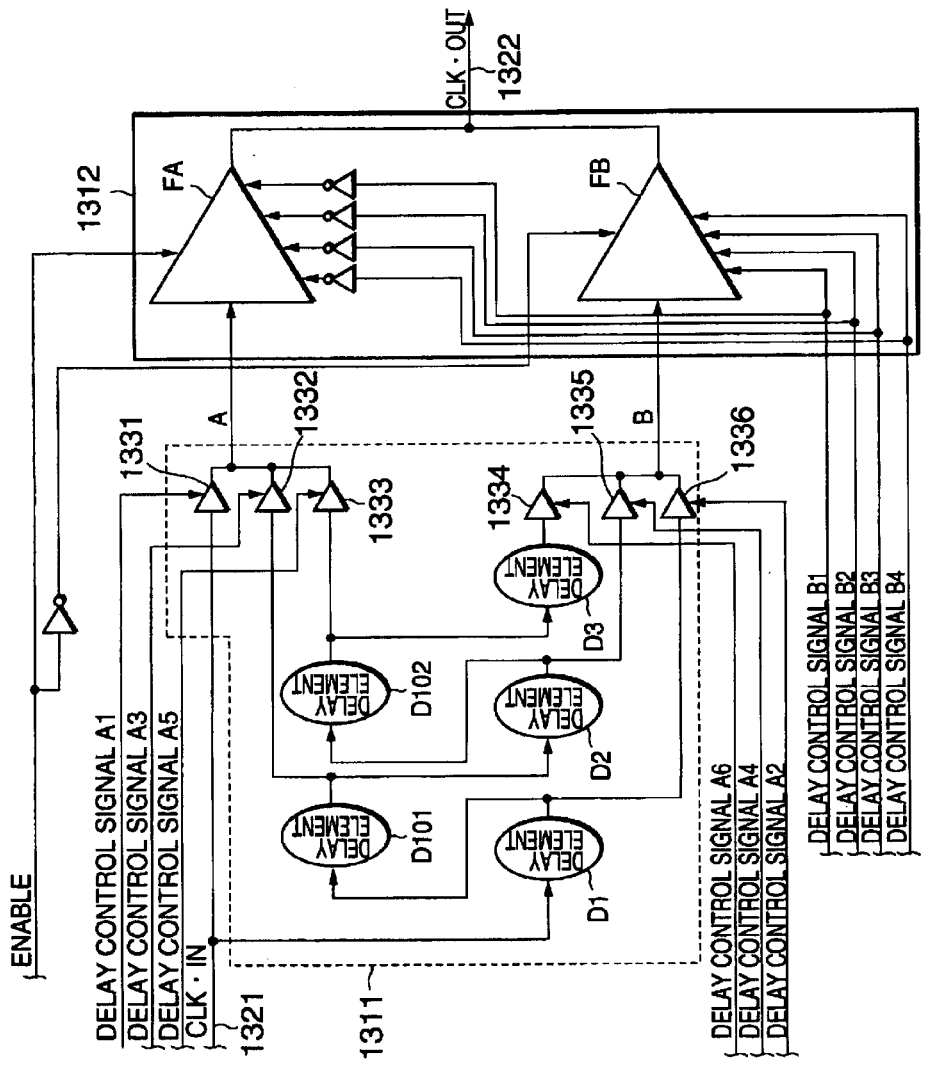
FIG. 13 is a circuit block diagram schematically showing a basic configuration of a DLL delay adjustment circuit according to a fourth embodiment of the present invention.

FIG. 13 is a circuit block diagram schematically showing a basic configuration of a DLL delay adjustment circuit according to a fourth embodiment of the present invention. A difference of a DLL delay adjustment circuit 1300 of the fourth embodiment from the DLL delay adjustment circuit 1200 of the third embodiment is only a change made by substituting 3-STATE circuitry (1331 to 1336) for the selection circuits S7 and S8 of the two systems in the circuitry of the delay rough adjustment circuit unit.

In the case of the DLL delay adjustment circuit of the fourth embodiment having the above-described changed circuitry of the delay rough adjustment circuit unit, an operation and operation effects are similar to those of the third embodiment. Thus, description of specific portions is omitted. According to the fourth embodiment, however, since the 3-STATE circuit is substituted for the selection circuits S7 and S8 of the two systems of the third embodiment, it is possible to shorten delay time more than that of the third embodiment.

Fifth Embodiment

Figure 14:
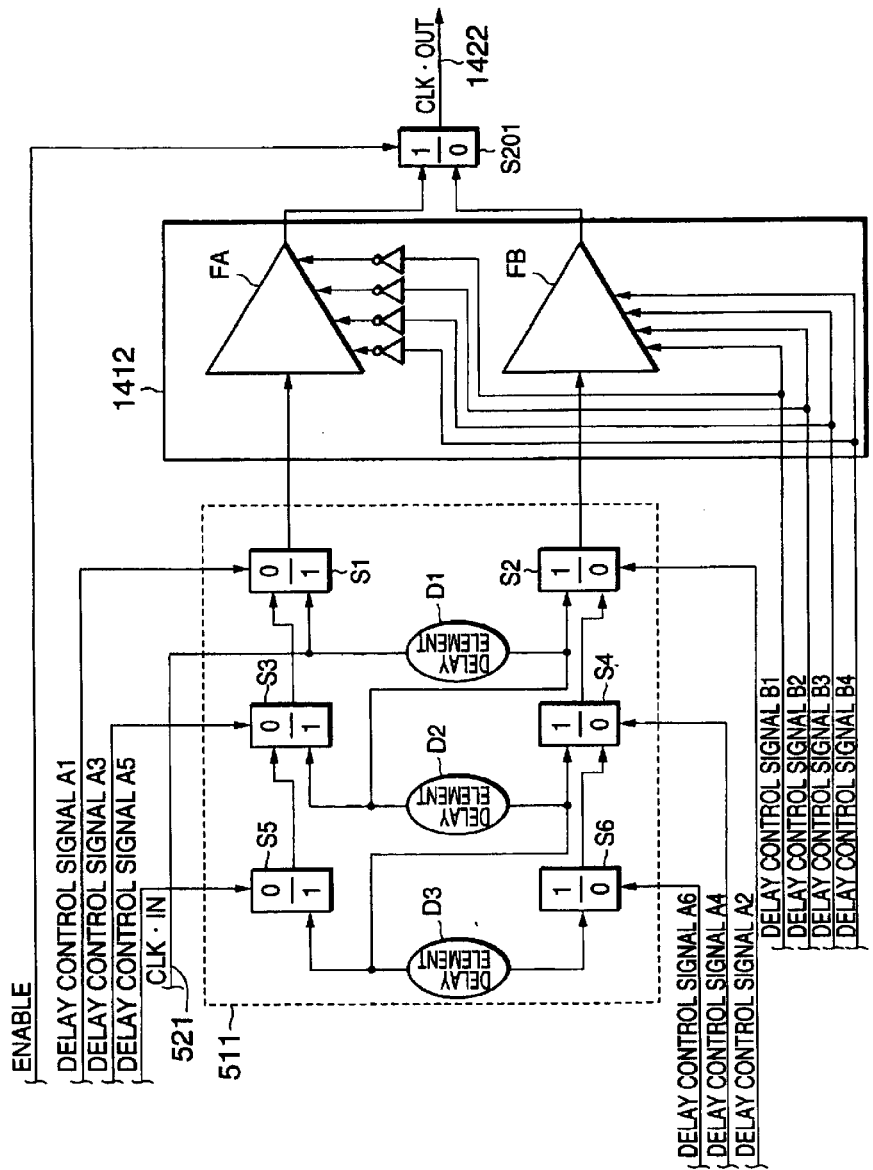
FIG. 14 is a circuit diagram schematically showing a basic configuration of a DLL delay adjustment circuit according to a fifth embodiment of the present invention.

FIG. 14 is a circuit block diagram schematically showing a main portion configuration of a DLL delay adjustment circuit according to a fifth embodiment of the present invention. This DLL delay adjustment circuit has a changed circuitry of the a delay fine adjustment circuit unit in the DLL delay adjustment circuit 500 of the first embodiment, and comprises an output selection circuit S201 for selectively outputting one of inputs of output clock signals CLK-OUT outputted from the second delay elements FA and FB of the two systems based on an enable signal ENABLE outputted from an external unit generated in synchronization of second delay control signals B1 to B4, instead of switching output operations of second delay elements FA and FB of the two systems by the enable signal ENABLE.

In the case of the DLL delay adjustment circuit of the fifth embodiment having the above-described changed circuitry of the delay fine adjustment circuit unit, an operation and operation effects are similar to those of the first embodiment, and thus description of specific portions is omitted. The changed circuitry of the delay fine adjustment circuit unit of the embodiment can be applied to all the delay fine adjustment circuits units of the DLL delay adjustment circuits of the first to fourth embodiments.

Figure 15:
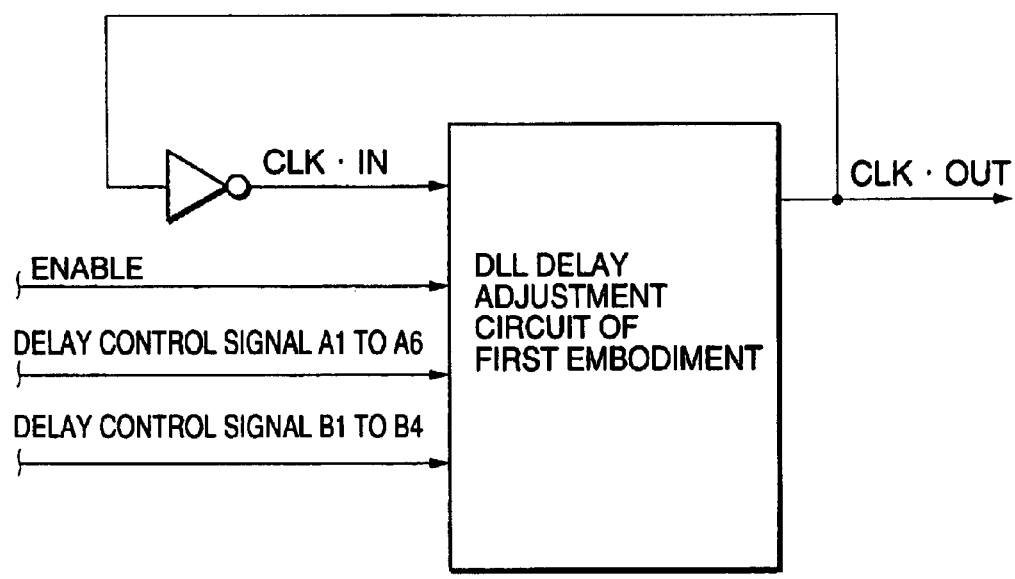
FIG. 15 is a circuit block diagram schematically showing a basic configuration of an oscillator constructed by using the DLL delay adjustment circuit of the first embodiment of the invention shown in FIG. 5.

FIG. 15 is a circuit block diagram schematically showing a basic configuration of an oscillator constructed by using the DLL delay adjustment circuit of the first embodiment. This oscillator is specifically configured in such a manner that by using the DLL delay adjustment circuit of the first embodiment, first delay control signals A1 to A6, second delay control signals B1 to B3 and an enable signal ENABLE are entered, and an inversion signal of an output clock signal CLK-OUT is connected as an input clock signal CLK-IN. Even a change in an oscillation width or an oscillation frequency can be quickly dealt with by switching operations to change connection patterns necessary for rough interval delay quantity adjustment and fine interval delay quantity adjustment based on the first delay control signals A1 to A6, and the second delay control signals B1 to B4.

Sixth Embodiment

Figure 16:
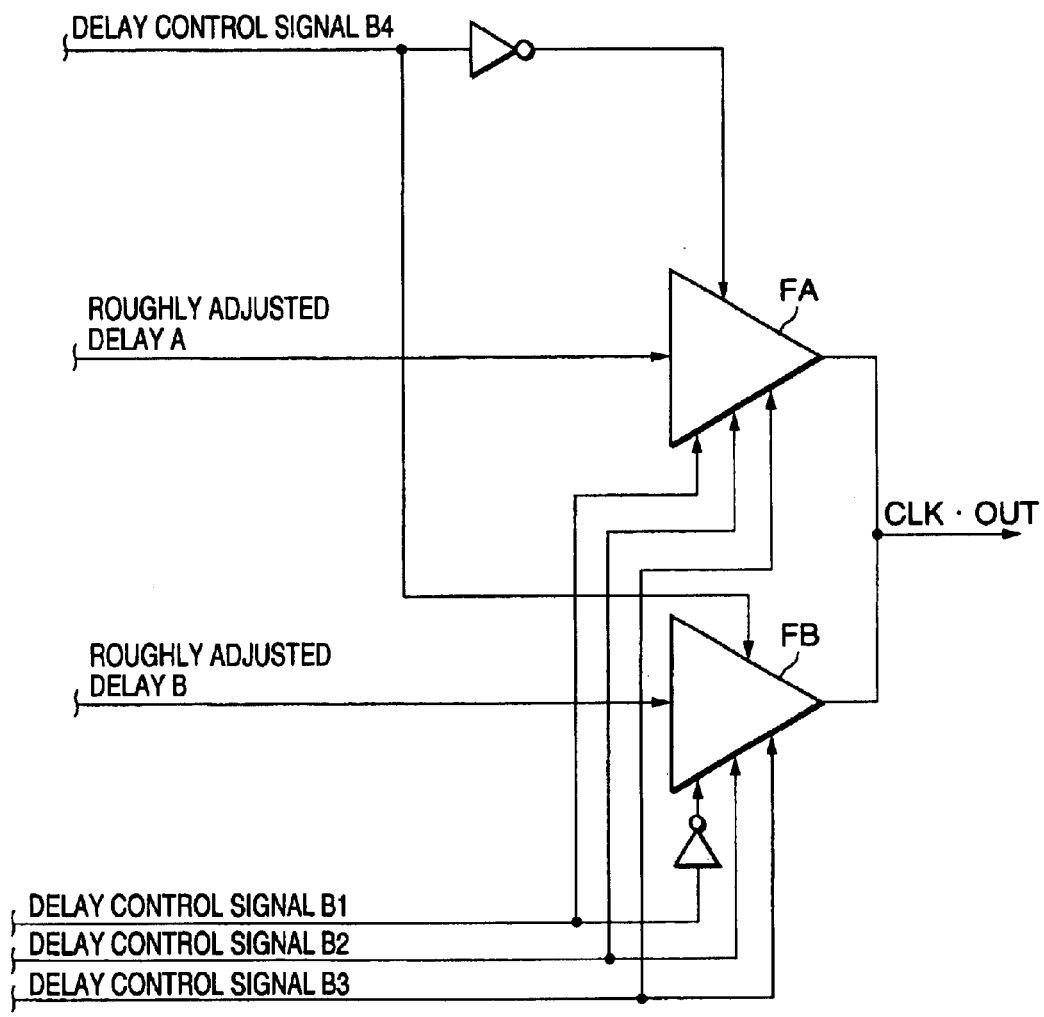
FIG. 16 is a circuit block diagram schematically showing a basic configuration of a DLL delay adjustment circuit according to a sixth embodiment of the present invention.

FIG. 16 is a circuit block diagram schematically showing a main portion configuration of a DLL delay adjustment circuit according to a sixth embodiment of the present invention. This DLL delay adjustment circuit is configured by changing circuitry regarding the second delay control signals B1 to B4 in the delay fine adjustment circuit unit of the DLL delay adjustment circuit of the first embodiment, and enabling output operations of second delay elements FA and FB of two systems for receiving outputs of roughly adjusted delays A and B to be switched based on gray codes transmitted as second delay control signals B1 to B4.

Specifically, a delay fine adjustment circuit unit of the embodiment is configured in such a manner that ones of normal rotation among the second delay control signals B1 to B3, and one of reverse rotation of the second delay control signal B4 are entered to the second delay element FA, and ones of normal rotation among the second delay control signals B2 to B4, and one of reverse rotation of the second delay control signal B1 are entered to the second delay element FB.

FIG. 17 is a numerical control correspondence table showing a specific operation of delay quantity adjustment based on the second delay control signals B1 to B4 as gray codes in the DLL delay quantity adjustment circuit of the sixth embodiment. Here, fine interval delay quantity adjustment is carried out each by 0.2ns. If gray codes are used for the second delay control signals B1 to B4 for setting delay quantities of the second delay elements FA and FB, values opposite the second delay control signals B1 to B4 are set, for example only by enabling the second delay control signal B4. Thus, an operation similar to that of the first embodiment can be performed by enabling the second delay control signal B4. In addition, in the circuitry of the first embodiment, the bits of the second delay control signals B1 to B4 were switched for the connection to the fine interval delay quantity adjustment by the second delay elements FA and FB. In the described case, however, connection of the same bits may be maintained. Thus, because of the circuitry shown in FIG. 16, an operation similar to that of the first embodiment is performed, thereby providing similar operation effects.

Therefore, in the case of the DLL delay adjustment circuit of the sixth embodiment having the above-described changed circuitry of the delay fine adjustment circuit unit, an operation and operation effects are similar to those of the first embodiment. However, the changed circuitry in the delay fine adjustment circuit unit of the embodiment can be applied to all the delay fine adjustment circuit units in the DLL delay adjustment circuits of the first to fourth embodiments.

Seventh Embodiment

Figure 18:
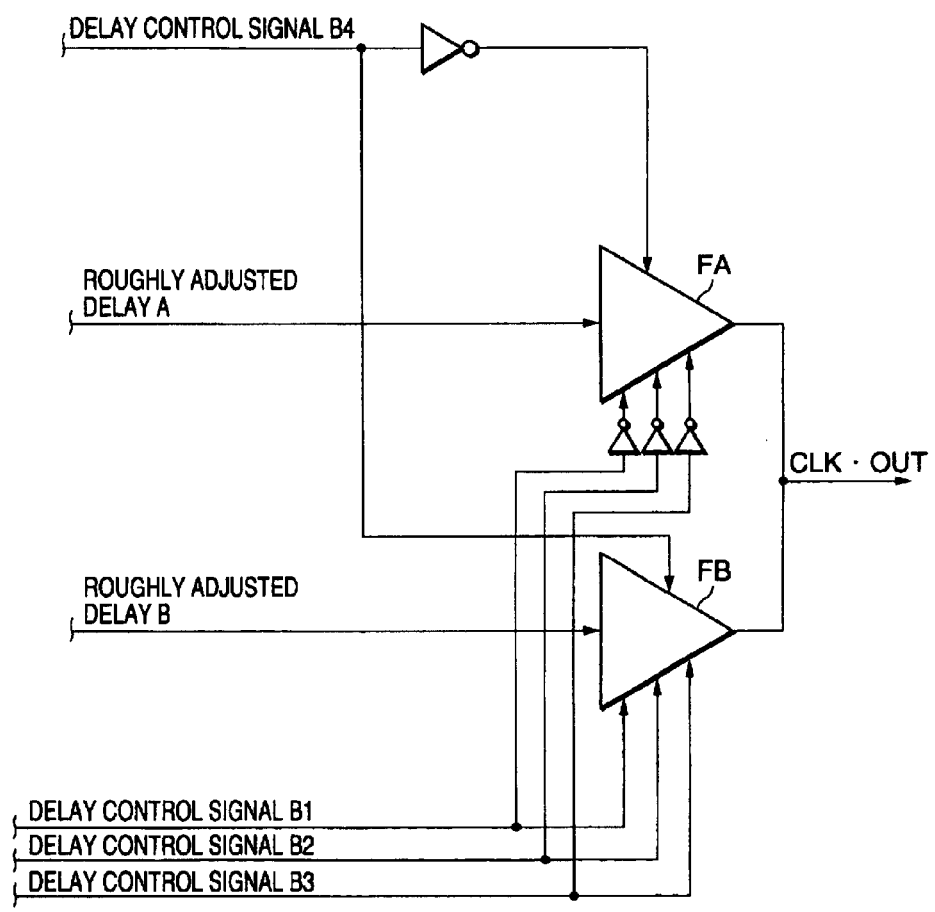
FIG. 18 is a circuit block diagram schematically showing a main-portion configuration of a DLL delay adjustment circuit according to a seventh embodiment of the present invention.

FIG. 18 is a circuit block diagram schematically showing a main portion configuration of a DLL delay adjustment circuit according to a seventh embodiment of the present invention. This DLL delay adjustment circuit is configured by changing circuitry regarding the second delay control signals B1 to B4 in the delay fine adjustment circuit unit of the DLL delay adjustment circuit of the first embodiment, and enabling output operations of second delay elements FA and FB of two systems for receiving outputs of roughly adjusted delays A and B to be switched based on gray codes transmitted as second delay control signals B1 to B4.

Specifically, a delay fine adjustment circuit unit of the embodiment is configured in such a manner that ones of reverse rotation among the second delay control signals B1 to B4 are entered to the second delay element FA, and ones of normal rotation among the second delay control signals B1 to B4 are entered to the second delay element FB.

FIG. 19 is a numerical control correspondence table showing a specific operation of delay quantity adjustment based on the second delay control signals B1 to B4 as gray codes in the DLL delay quantity adjustment circuit of the seventh embodiment.

In this case, fine interval delay quantity adjustment is carried out each by 0.2 ns. If gray codes are used for the second delay control signals B1 to B4 for setting delay quantities of the second delay elements FA and FB, values opposite the second delay control signals B1 to B3 are set, for example only by inverting the second delay control signals B1 to B3. Thus, an operation similar to that of the first embodiment can be performed by enabling the second delay control signal B4. In addition, in the circuitry of the first embodiment, the bits of the second delay control signals B1 to B4 were switched for the connection to the fine interval delay quantity adjustment by the second delay elements FA and FB. In the described case, however, connection of the same bits may be maintained. Thus, because of the circuitry shown in FIG. 18, an operation similar to that of the first embodiment is performed, thereby providing similar operation effects.

Therefore, in the case of the DLL delay adjustment circuit of the seventh embodiment having the above-described changed circuitry of the delay fine adjustment circuit unit, an operation and operation effects are similar to those of the first embodiment. However, the changed circuitry in the delay fine adjustment circuit unit of the embodiment can be applied to all the delay fine adjustment circuit units in the DLL delay adjustment circuits of the first to fourth embodiments.

As described above, according to the DLL delay adjustment circuit of the present invention, in order to make rough interval delay quantity adjustment without any effects on the output clock signal, in the delay rough adjustment circuit unit, the selection circuits disposed in the odd-number and even-number stages, which are connected to the plurality of first delay elements to selectively obtain delay outputs thereof by the two systems, are switched by the plurality of delay control signals from the external unit, thereby obtaining outputs of two-system roughly adjusted delays selectively. Thus, a switching timing condition for rough interval delay quantity adjustment can be relaxed.

Furthermore, at the delay fine adjustment circuit unit, the connections of the second delay elements of the two systems added to the outputs of the roughly adjusted delays of the two systems to make delay quantity adjustment of a fine interval are switched by the enable signal synchronized with the second delay control signals for setting delay quantities thereof at points of no changes in these signals. Accordingly, the operations are switched to change the connection patterns necessary for the delay quantity adjustments of both rough and fine intervals. Therefore, it is possible to achieve a high-speed operation under the condition of a wide frequency band after prevention of noise generation or output delay error generation during switching by delay control signals, which has been difficult in the conventional circuitry.

What is claimed is:

1. A delay adjustment circuit for a delay locked loop comprising:

a delay rough adjustment circuit unit for carrying out delay quantity adjustment of a rough interval, said circuit unit including first delay elements having a maximum delay value of delay quantity adjustment of an interval finer than said rough interval, and selection circuits for receiving first delay control signals from an external unit to select and control delay outputs obtained from said first delay elements as delay quantities of said rough interval, and dividing said selection circuits into odd-number and even-number stages; and a delay fine adjustment circuit unit including second delay elements for receiving outputs of roughly adjusted delays of said odd-number and even-number stages of said selection circuits, selectively carrying out fine interval delay quantity adjustments of the said second delay elements by opposite operations, and obtaining said an output clock signal, wherein said delay fine adjustment circuit unit adds a delay quantity of a fine interval set by said second delay elements to a delay quantity of a said rough interval obtained as said output of a roughly adjusted delay from said first delay elements selected by said selection circuits based on said first delay control signals, and outputs a result of the addition as said output clock signal based on said second delay control signals, said first delay control signals are separately transmitted to said selection circuits of said odd-number and even-number stages to select delay outputs of said plurality of first delay elements, and control is executed to switch outputs of roughly adjusted delays of said selection circuits when delay differences of fine interval delay quantity adjustments between said selection circuits of said odd-number and even-number stages become equal to each other.

2. A delay adjustment circuit for a delay locked loop comprising:

a delay rough adjustment circuit unit for carrying out delay quantity adjustment of a rough interval, said circuit unit including first delay elements having a maximum delay value of delay quantity adjustment of an interval finer than said rough interval, and a plurality of delay selection circuits for receiving first delay control signals from an external unit to select and control delay outputs obtained from said first delay elements as delay quantities of said rough interval, and dividing said delay selection circuits into odd-number and even-number stages; and a delay fine adjustment circuit unit including second delay elements for receiving outputs of roughly adjusted delays of said odd-number and even-number stages of said delay selection circuits, selectively carrying out fine interval delay quantity adjustments of the said second delay elements by opposite operations, and obtaining an output clock signal, wherein said delay fine adjustment circuit unit adds a delay quantity of a fine interval set by said second delay elements to a delay quantity of said rough interval obtained as said output of a roughly adjusted delay from said first delay elements selected by said delay selection circuits based on said first delay control signals, and outputs a result of the addition as said output clock signal based on said second delay control signals, said first delay control signals are separately transmitted to said delay selection circuits of said odd-number and even-number stages to select delay outputs of said plurality of first delay elements, and control is executed to switch outputs of roughly adjusted delays of said delay selection circuits when delay differences of fine interval delay quantity adjustments between said delay selection circuits of said odd-number and even-number stages become equal to each other, wherein said delay selection circuits having said first delay elements, and selection circuits for receiving said first delay control signals from said external unit to select and control delay outputs obtained from said first delay elements as delay quantities of said rough interval, and, wherein said delay selection circuits of said odd-number and even-number stages respectively configured by combining and connecting first delay selection circuits operated for output according to a HIGH level signal from an external unit based on an input clock signal CLK-IN, second delay selection circuits and said second delay selection circuits operated for output according to said delay control signals based on the input clock signal CLK-IN, and third delay selection circuits operated for output according to a LOW level signal from the external unit.

3. The delay adjustment circuit for the delay locked loop according to claim 1, further comprising an output selection circuit for selectively outputting one of inputs of output clock signals outputted from said second delay elements based on an enable signal from an external unit generated in synchronization with said second delay control signals.

4. The delay adjustment circuit for the delay locked loop according to claim 2, further comprising an output selection circuit for selectively outputting one of inputs of output clock signals outputted from said second delay elements based on an enable signal from an external unit generated in synchronization with said second delay control signals.

5. The delay adjustment circuit for the delay locked loop according to claim 1, wherein said second delay elements are turned on/off one at a time by an enable signal from an external unit generated in synchronization with said second delay control signals.

6. The delay adjustment circuit for the delay locked loop according to claim 2, wherein said second delay elements are turned on/off one at a time by an enable signal from an external unit generated in synchronization with said second delay control signals.

7. The delay adjustment circuit for the delay locked loop according to claim 5, wherein said enable signal is connected directly to said second delay element and an inverted enable signal is connected directly to said second delay element so that when one second element is enabled, the other is disenabled.

8. The delay adjustment circuit for the delay locked loop according to claim 6, wherein said enable signal is connected directly to said second delay element and an inverted enable signal is connected directly to said second delay element so that when one second element is enabled, the other is disenabled.

9. The delay adjustment circuit for the delay locked loop according to claim 1, wherein said second delay elements are turned on/off one at a time by gray codes transmitted as said second delay control signals.

10. The delay adjustment circuit for the delay locked loop according to claim 2, wherein said second delay elements are turned on/off one at a time by gray codes transmitted as said second delay control signals.

11. The delay adjustment circuit for the delay locked loop according to claim 1, wherein said second delay elements are turned on/off one at a time by binary codes transmitted as said second delay control signals.

12. The delay adjustment circuit for the delay locked loop according to claim 2, wherein said second delay elements are turned on/off one at a time by binary codes transmitted as said second delay control signals.

* * * * *

UNITED STATES PATENT AND TRADEMARK OFFICE
CERTIFICATE OF CORRECTION

PATENT NO. : 6,791,384 B2
DATED : September 14, 2004
INVENTOR(S) : Iwashita

It is certified that error appears in the above-identified patent and that said Letters Patent is hereby corrected as shown below:

<u>Title page,</u>
Item [73], Assignee, should read -- NEC Electronics Corporation (JP) --

Signed and Sealed this

Seventeenth Day of May, 2005

JON W. DUDAS
*Director of the United States Patent and Trademark Office*

UNITED STATES PATENT AND TRADEMARK OFFICE
CERTIFICATE OF CORRECTION

PATENT NO. : 6,791,384 B2
DATED : September 14, 2004
INVENTOR(S) : Iwashita

It is certified that error appears in the above-identified patent and that said Letters Patent is hereby corrected as shown below:

<u>Title page,</u>
Item [73], Assignee, should read -- NEC Electronics Corporation (JP) --

Signed and Sealed this

Twenty-eighth Day of June, 2005

JON W. DUDAS
*Director of the United States Patent and Trademark Office*